(12) United States Patent
Sawabe et al.

(10) Patent No.: US 8,124,909 B2
(45) Date of Patent: Feb. 28, 2012

(54) LASER PROCESSING APPARATUS

(75) Inventors: Taiki Sawabe, Tokyo (JP); Keiji Nomaru, Tokyo (JP)

(73) Assignee: Disco Corporation, Tokyo (JP)

( * ) Notice: Subject to any disclaimer, the term of this patent is extended or adjusted under 35 U.S.C. 154(b) by 366 days.

(21) Appl. No.: 12/415,196

(22) Filed: Mar. 31, 2009

(65) Prior Publication Data

US 2009/0266802 A1 Oct. 29, 2009

(30) Foreign Application Priority Data

Apr. 28, 2008 (JP) .................................. 2008-117558

(51) Int. Cl.
*B23K 26/14* (2006.01)
(52) U.S. Cl. .......... 219/121.67; 219/121.78; 219/121.72
(58) Field of Classification Search ............. 219/121.67, 219/121.72, 121.78, 121.82, 121.85, 121.62, 219/121.68, 121.76, 121.6, 121.58; 438/460, 438/458, 463, 462, 464, 465, 113, 114, 535, 438/487, 33, 758; 359/850, 861, 876, 216, 359/858, 485.01, 485.06, 489.07
See application file for complete search history.

(56) References Cited

U.S. PATENT DOCUMENTS

| 7,580,136 | B2 | 8/2009 | Sawabe et al. |
| 2007/0119835 | A1* | 5/2007 | Nomaru ................. 219/121.73 |
| 2007/0228020 | A1* | 10/2007 | Oba ....................... 219/121.67 |

FOREIGN PATENT DOCUMENTS

| JP | 10-305420 | 11/1998 |
| JP | 2007-152355 | 6/2007 |

* cited by examiner

*Primary Examiner* — Quang Van
*Assistant Examiner* — Phuong Nguyen
(74) *Attorney, Agent, or Firm* — Greer, Burns & Crain, Ltd.

(57) ABSTRACT

A laser processing apparatus including a height detecting device for detecting the height of a workpiece held on a chuck table. The height detecting device includes an annular spot forming unit for forming the spot shape of a detecting laser beam into an annular spot shape, a pinhole mask for passing the reflected light reflected on the upper surface of the workpiece held on the chuck table, but blocking the reflected light reflected on the lower surface of the workpiece, and a reflected light analyzing unit for analyzing the reflected light passed through the pinhole mask and transmitting the result of analyzation to a control unit. The laser processing apparatus further includes a focusing unit having an objective lens for focusing a processing laser beam having a circular spot shape and the detecting laser beam having the annular spot shape and a window lens for focusing the detecting laser beam focused by the objective lens without focusing the processing laser beam.

2 Claims, 16 Drawing Sheets

LASER PROCESSING APPARATUS

BACKGROUND OF THE INVENTION

1. Field of the Invention

The present invention relates to a laser processing apparatus for performing laser processing along streets formed on a wafer such as a semiconductor wafer.

2. Description of the Related Art

In a semiconductor device fabrication process, the front side of a substantially disk-shaped semiconductor wafer is formed with a plurality of crossing division lines called streets to thereby define a plurality of partitioned regions arranged like a matrix, and a plurality of devices such as ICs (Integrated Circuit) and LSIs (Large Scale Integration) are formed in these partitioned regions. The semiconductor wafer is cut along these streets to divide the partitioned regions, thus fabricating the individual devices. Further, an optical device wafer is fabricated by layering photodetectors such as photodiodes or light emitting devices such as laser diodes on the front side of a sapphire substrate. The optical device wafer is cut along streets to divide the individual optical devices such as photodiodes and laser diodes, which are widely used in electrical equipment.

As a method of cutting a wafer such as a semiconductor wafer and an optical device wafer along the streets, a method of forming a laser processed groove is known. In this method, a pulsed laser beam is applied to the wafer along each street to thereby form a laser processed groove along each street. The wafer is cut (broken) along each laser processed groove (see Japanese Patent Laid-open No. Hei 10-305420, for example).

In this method of forming the laser processed grooves by applying a pulsed laser beam along the streets formed on the wafer, the pulsed laser beam has an absorption wavelength (e.g., 355 nm) to the wafer, and the focal point of the pulsed laser beam is set on the subject surface of the wafer to be processed. However, the wafer has undulations, causing variations in thickness. As a result, the focal point of the laser beam applied to the wafer cannot be set on the subject surface of the wafer, so that a laser processed groove having a uniform depth cannot be formed along each street. Accordingly, in order to form a laser processed groove having a uniform depth along each street on the wafer, variations in thickness in a subject area on the wafer to which the laser beam is applied must be detected and laser beam applying means must be moved to follow such variations in thickness.

To solve this problem, there has been proposed a laser processing apparatus including height detecting means for detecting the height of the front side (upper surface) of a workpiece held on a chuck table by applying a laser beam of visible light to the front side (upper surface) of the workpiece to detect the height according to the light quantity corresponding to the area of reflection of the laser beam applied to the front side (upper surface) of the workpiece (see Japanese Patent Laid-open No. 2007-152355, for example).

According to the height detecting means disclosed in Japanese Patent Laid-open No. 2007-152355 mentioned above, the laser beam of visible light is not transmitted through the wafer as a workpiece in the case that the wafer is formed of silicon. Accordingly, in this case, the light quantity corresponding to the area of reflection of the laser beam applied to the front side (upper surface) of the workpiece can be accurately measured. However, in the case that the wafer is formed of a transparent material such as sapphire and quartz, the laser beam is reflected both on the front side (upper surface) of the workpiece and on the back side (lower surface) of the workpiece. Accordingly, in this case, the light quantity of the reflected light from only the front side (upper surface) of the workpiece cannot be measured. Thus, according to the height detecting means disclosed in the above publication, the height of the front side of the workpiece cannot be detected in the case that the workpiece is formed of a transparent material.

To solve this problem, the present applicant has proposed a height detecting apparatus capable of reliably detecting the height of a workpiece held on a chuck table even when the workpiece is formed of a transparent material in Japanese Patent Application No. 2007-231907. According to this height detecting apparatus, a detecting laser beam having a circular spot shape oscillated from detecting laser beam oscillating means is converted into a laser beam having an annular spot shape by annular spot forming means. This detecting laser beam having the annular spot shape is applied to the workpiece.

The detecting laser beam having the annular spot shape applied to the workpiece is reflected on the upper surface of the workpiece with an annular spot shape. In the case that the workpiece is transparent, the detecting laser beam having the annular spot shape applied to the workpiece is also reflected on the lower surface of the workpiece with another annular spot shape. In this case, the size of the annular spot shape of the reflected light reflected on the lower surface of the workpiece is larger than the size of the annular spot shape of the reflected light reflected on the upper surface of the workpiece. Accordingly, the reflected light having the larger annular spot shape reflected on the lower surface of the workpiece is blocked by a pinhole mask, and only the reflected light having the smaller annular spot shape reflected on the upper surface of the workpiece is passed through the pinhole of the pinhole mask. Then, the light quantity is detected according to the reflected light having the smaller annular spot shape reflected on the upper surface of the workpiece.

Further, an objective lens for focusing the detecting laser beam (having a wavelength of 635 nm, for example) is required to have a relatively large NA in order to clearly distinguish the size of the smaller annular spot shape of the reflected light reflected on the upper surface of the workpiece from the size of the larger annular spot shape of the reflected light reflected on the lower surface of the workpiece. On the other hand, an objective lens for focusing the processing laser beam (having a wavelength of 355 nm, for example) has a relatively small NA (e.g., 0.2). Accordingly, the detecting laser beam and the processing laser beam cannot be simultaneously applied along the same optical axis. That is, it is impossible to detect the height of the workpiece by using the detecting laser beam and simultaneously follow the focal position of the processing laser beam.

SUMMARY OF THE INVENTION

It is therefore an object of the present invention to provide a laser processing apparatus which can detect the height of a workpiece held on a chuck table and follow the focal position of a processing laser beam even when the workpiece is formed of a transparent material.

In accordance with an aspect of the present invention, there is provided a laser processing apparatus including a chuck table having a holding surface for holding a platelike workpiece; processing laser beam applying means for applying a processing laser beam to the upper surface of the workpiece held on the chuck table, the processing laser beam applying means including processing laser beam oscillating means for oscillating the processing laser beam and focusing means for focusing the processing laser beam oscillated by the processing laser beam oscillating means; feeding means for relatively moving the chuck table and the processing laser beam applying means in a feeding direction; focal position adjusting means for changing the focal position of the processing laser beam to be focused by the focusing means; height detecting means for detecting the height of the workpiece held on the chuck table; and control means for controlling the focal position adjusting means according to a detection signal from the height detecting means; the height detecting means including detecting laser beam oscillating means for oscillating a detecting laser beam having a wavelength different from the wavelength of the processing laser beam; annular spot forming means for forming the spot shape of the detecting laser beam oscillated by the detecting laser beam oscillating means into an annular spot shape; a detecting laser beam applying path for leading the detecting laser beam having the annular spot shape from the annular spot forming means to the focusing means; a detecting laser beam reflecting path for leading reflected light obtained by reflecting the detecting laser beam applied through the detecting laser beam applying path and the focusing means to the workpiece held on the chuck table; a pinhole mask provided in the detecting laser beam reflecting path for passing the reflected light reflected on the upper surface of the workpiece, but blocking the reflected light reflected on the lower surface of the workpiece; and reflected light analyzing means for analyzing the reflected light passed through the pinhole mask and transmitting the result of analyzation to the control means; the focusing means including an objective lens for focusing the processing laser beam and the detecting laser beam; and a window lens for focusing the detecting laser beam having the annular spot shape without focusing the processing laser beam.

Preferably, the processing laser beam applying means further includes optical path changing means for changing the optical path of the processing laser beam to be focused by the focusing means in the feeding direction.

As described above, the focusing means for focusing the processing laser beam and the detecting laser beam includes the objective lens for focusing the processing laser beam and the detecting laser beam and the window lens for focusing the detecting laser beam without focusing the processing laser beam. Thus, the detecting laser beam having the annular spot shape to be applied to the workpiece is focused by the objective lens and the window lens. Accordingly, the NA of the focusing lens can be increased, so that the ratio in size between the annular spot shape reflected on the upper surface of the workpiece and the annular spot shape reflected on the lower surface of the workpiece can be increased. As a result, the reflected light having the annular spot shape reflected on the lower surface of the workpiece can be reliably blocked by the pinhole mask. Accordingly, it is possible to detect the height of the workpiece held on the chuck table and follow the focal position of the processing laser beam even when the workpiece is formed of a transparent material.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENTS

Figure 1:
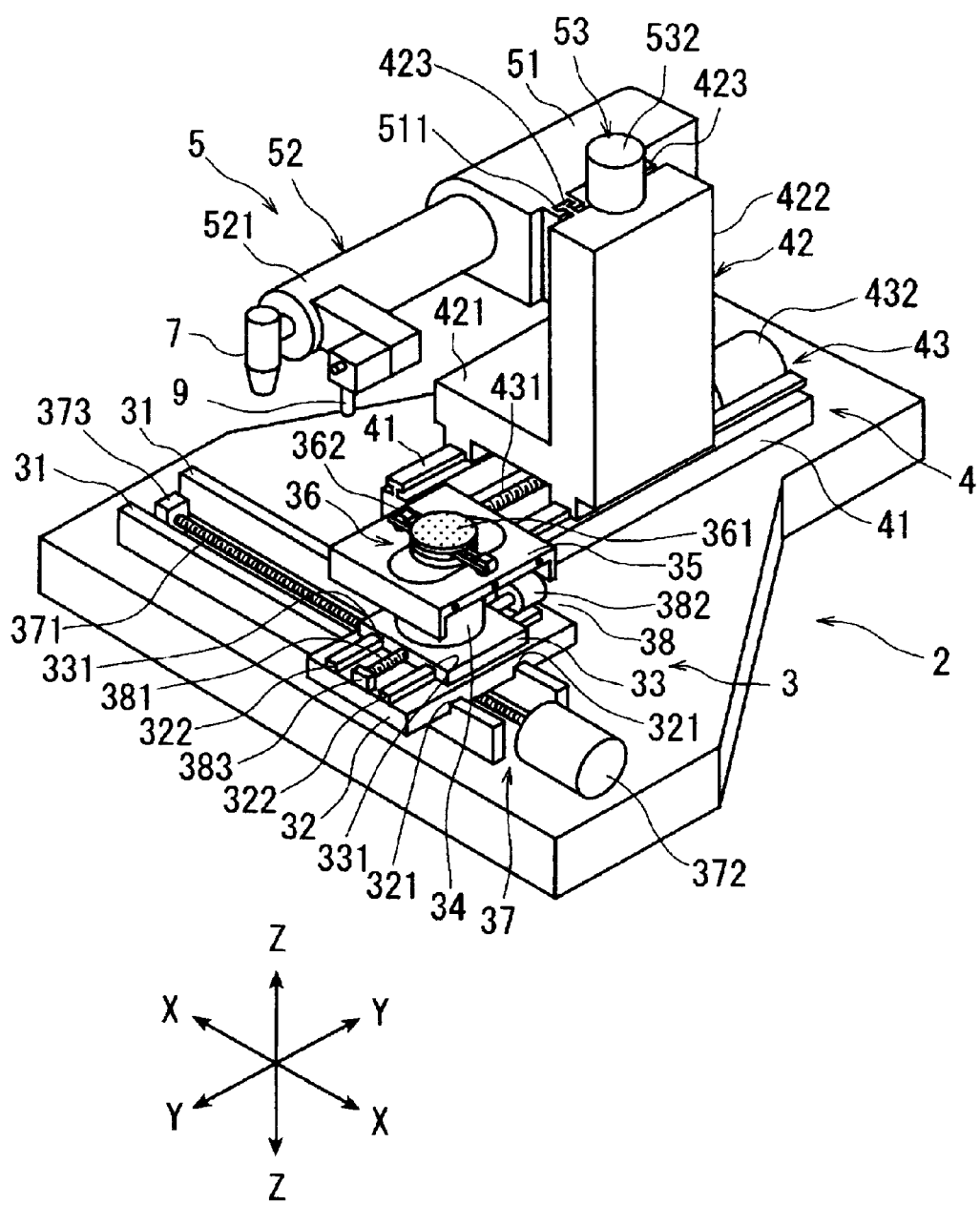
FIG. 1 is a perspective view of a laser processing apparatus according to a preferred embodiment of the present invention.

There will now be described a preferred embodiment of the laser processing apparatus according to the present invention with reference to the attached drawings. FIG. 1 is a perspective view of a laser processing apparatus according to a preferred embodiment of the present invention. The laser processing apparatus shown in FIG. 1 includes a stationary base 2, a chuck table mechanism 3 for holding a workpiece, the chuck table mechanism 3 being provided on the stationary base 2 so as to be movable in a feeding direction (X direction) shown by an arrow X, a laser beam applying unit supporting mechanism 4 provided on the stationary base 2 so as to be movable in an indexing direction (Y direction) shown by an arrow Y perpendicular to the feeding direction (X direction) shown by the arrow X mentioned above, and a laser beam applying unit 5 provided on the laser beam applying unit supporting mechanism 4 so as to be movable in a direction (Z direction) shown by an arrow Z.

The chuck table mechanism 3 includes a pair of guide rails 31 provided on the stationary base 2 so as to extend parallel to each other in the feeding direction (X direction) shown by the arrow X, a first sliding block 32 slidably provided on the guide rails 31 so as to be movable in the feeding direction (X direction) shown by the arrow X, a second sliding block 33 slidably provided on the first sliding block 32 so as to be movable in the indexing direction (Y direction) shown by the arrow Y, a cover table 35 supported through a cylindrical member 34 on the second sliding block 33, and a chuck table 36 as work holding means. The chuck table 36 has a vacuum chuck 361 formed of a porous material. A workpiece such as a disk-shaped semiconductor wafer is held on the vacuum chuck 361 as a work holding surface by suction means (not shown). The chuck table 36 is rotatable by a pulse motor (not shown) provided in the cylindrical member 34. The chuck table 36 further has a clamp 362 for fixing an annular frame to be hereinafter described.

A pair of guided grooves 321 slidably fitted with the pair of guide rails 31 mentioned above are formed on the lower surface of the first sliding block 32, and a pair of guide rails 322 are provided on the upper surface of the first sliding block 32 so as to extend parallel to each other in the indexing direction (Y direction) shown by the arrow Y. Accordingly, the first sliding block 32 is movable in the feeding direction (X direction) shown by the arrow X along the guide rails 31 by the slidable fit of the guided grooves 321 with the guide rails 31. The chuck table mechanism 3 further includes feeding mechanism 37 for moving the first sliding block 32 in the feeding direction (X direction) shown by the arrow X along the guide rails 31.

The feeding mechanism 37 includes an externally threaded rod 371 extending parallel to the guide rails 31 so as to be interposed therebetween and a pulse motor 372 as a drive source for rotationally driving the externally threaded rod 371. The externally threaded rod 371 is rotatably supported at one end thereof to a bearing block 373 fixed to the stationary base 2 and connected at the other end to the output shaft of the pulse motor 372 so as to receive the torque thereof. The externally threaded rod 371 is engaged with a tapped through hole formed in an internally threaded block (not shown) projecting from the lower surface of the first sliding block 32 at a central portion thereof. Accordingly, the first sliding block 32 is moved in the feeding direction (X direction) shown by the arrow X along the guide rails 31 by driving the pulse motor 372 to normally or reversely rotate the externally threaded rod 371.

A pair of guided grooves 331 slidably fitted with the pair of guide rails 322 provided on the upper surface of the first sliding block 32 are formed on the lower surface of the second sliding block 33. Accordingly, the second sliding block 33 is movable in the indexing direction (Y direction) shown by the arrow Y by the slidable fit of the guided grooves 331 with the guide rails 322. The chuck table mechanism 3 further includes first indexing means 38 for moving the second sliding block 33 in the indexing direction (Y direction) shown by the arrow Y along the guide rails 322 of the first sliding block 32.

The first indexing means 38 includes an externally threaded rod 381 extending parallel to the guide rails 322 so as to be interposed therebetween and a pulse motor 382 as a drive source for rotationally driving the externally threaded rod 381. The externally threaded rod 381 is rotatably supported at one end thereof to a bearing block 383 fixed to the upper surface of the first sliding block 32 and connected at the other end to the output shaft of the pulse motor 382 so as to receive the torque thereof. The externally threaded rod 381 is engaged with a tapped through hole formed in an internally threaded block (not shown) projecting from the lower surface of the second sliding block 33 at a central portion thereof. Accordingly, the second sliding block 33 is moved in the indexing direction (Y direction) shown by the arrow Y along the guide rails 322 by driving the pulse motor 382 to normally or reversely rotate the externally threaded rod 381.

The laser beam applying unit supporting mechanism 4 includes a pair of guide rails 41 provided on the stationary base 2 so as to extend parallel to each other in the indexing direction (Y direction) shown by the arrow Y and a movable support base 42 slidably supported to the guide rails 41 so as to be movable in the direction shown by the arrow Y. The movable support base 42 is composed of a horizontal portion 421 slidably supported to the guide rails 41 and a vertical portion 422 extending vertically upward from the upper surface of the horizontal portion 421. A pair of guide rails 423 are provided on one side surface of the vertical portion 422 so as to extend parallel to each other in the direction (Z direction) shown by the arrow Z. The laser beam applying unit supporting mechanism 4 shown in FIG. 1 further includes second indexing means 43 for moving the movable support base 42 in the indexing direction (Y direction) shown by the arrow Y along the guide rails 41.

The second indexing means 43 includes an externally threaded rod 431 extending parallel to the guide rails 41 so as to be interposed therebetween and a pulse motor 432 as a drive source for rotationally driving the externally threaded rod 431. The externally threaded rod 431 is rotatably supported at one end thereof to a bearing block (not shown) fixed to the stationary base 2 and connected at the other end to the output shaft of the pulse motor 432 so as to receive the torque thereof. The externally threaded rod 431 is engaged with a tapped through hole formed in an internally threaded block (not shown) projecting from the lower surface of the horizontal portion 421 included in the movable support base at a central portion thereof. Accordingly, the movable support base 42 is moved in the indexing direction (Y direction) shown by the arrow Y along the guide rails 41 by driving the pulse motor 432 to normally or reversely rotate the externally threaded rod 431.

The laser beam applying unit 5 includes a unit holder 51 and laser beam applying means 52 mounted on the unit holder 51. The unit holder 51 is formed with a pair of guided grooves 511 slidably fitted with the pair of guide rails 423 of the vertical portion 422. Accordingly, the unit holder 51 is slidably supported to the vertical portion 422 of the movable support base 42 so as to be movable in the direction (Z direction) shown by the arrow Z by the slidable fit of the guided grooves 511 with the guide rails 423.

The laser beam applying unit 5 further includes first focal position adjusting means 53 for moving the unit holder 51 in the focal position adjusting direction (Z direction) shown by the arrow Z along the guide rails 423, i.e., in the direction perpendicular to the work holding surface of the chuck table 36. The first focal position adjusting means 53 includes an externally threaded rod (not shown) extending parallel to the guide rails 423 so as to be interposed therebetween and a pulse motor 532 as a drive source for rotationally driving this externally threaded rod. Accordingly, the unit holder 51 and the laser beam applying means 52 are moved in the focal position adjusting direction (Z direction) shown by the arrow Z along the guide rails 423 by driving the pulse motor 532 to normally or reversely rotate this externally threaded rod. In this preferred embodiment, when the pulse motor 532 is normally driven, the laser beam applying means 52 is moved upward, whereas when the pulse motor 532 is reversely driven, the laser beam applying means 52 is moved downward.

The laser beam applying means 52 includes a cylindrical casing 521 fixed to the unit holder 51 so as to extend substantially horizontally. The casing 521 contains processing pulsed laser beam oscillating means 6 shown in FIG. 2. Further, as shown in FIG. 1, focusing means 7 for focusing a processing pulsed laser beam oscillated by the processing pulsed laser beam oscillating means 6 onto the workpiece held on the chuck table 36 is provided at the front end of the casing 521. The processing pulsed laser beam oscillating means 6 functions to oscillate a processing pulsed laser beam LB1 having an absorption wavelength to the wafer as a workpiece.

The processing pulsed laser beam oscillating means 6 may be provided by a YVO4 pulsed laser oscillator or YAG pulsed laser oscillator for oscillating the processing pulsed laser beam LB1 having a wavelength of 355 nm. The laser beam applying means 52 further includes a scanning mirror 60 as optical path changing means provided in a path for introducing the processing pulsed laser beam LB1 oscillated from the processing pulsed laser beam oscillating means 6 into the focusing means 7. The scanning mirror 60 functions to change the optical path of the processing pulsed laser beam LB1 in the feeding direction (X direction) shown by the arrow X in FIG. 1.

Figure 2:
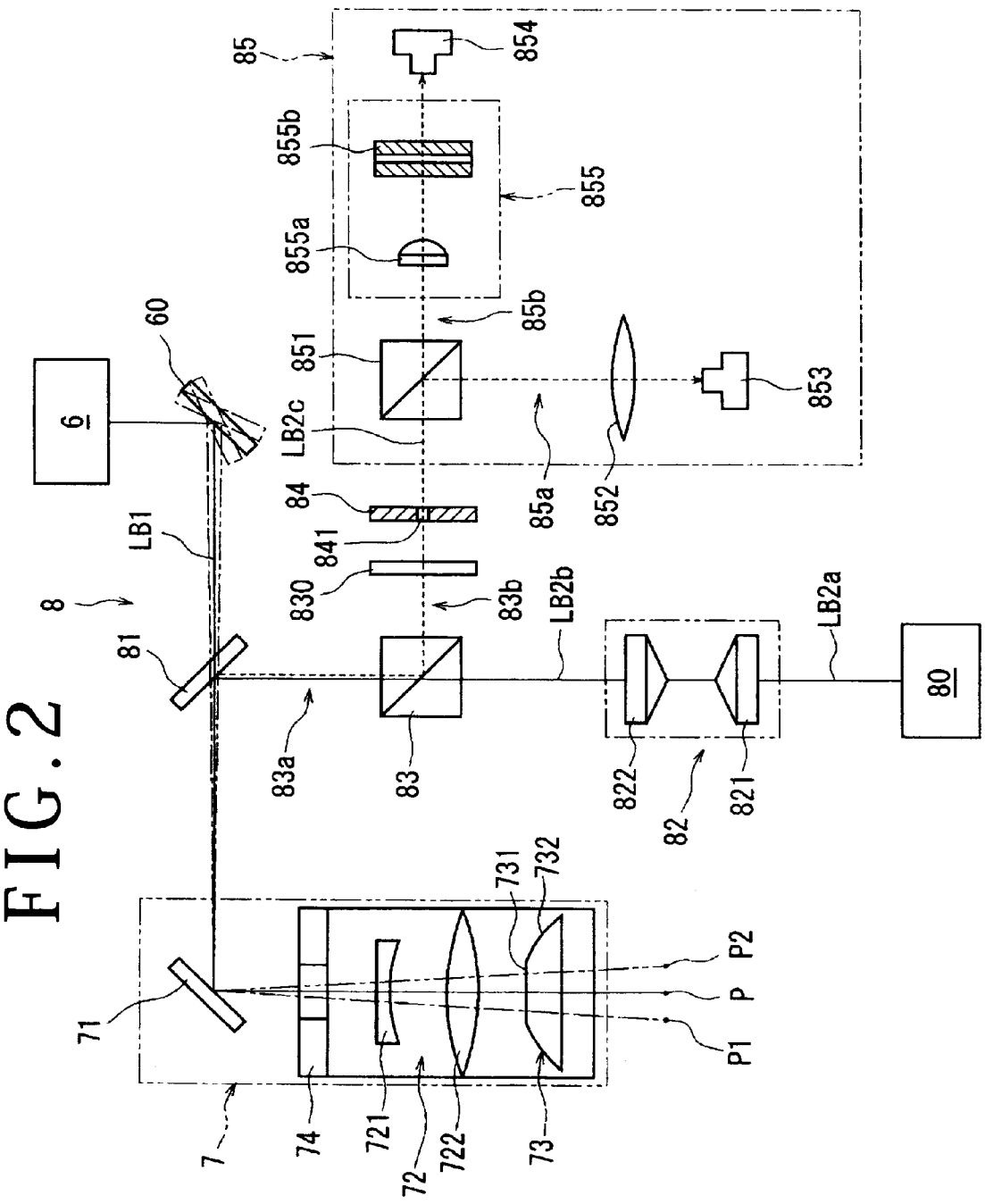
FIG. 2 is a block diagram showing the configuration of laser beam applying means and height detecting means held on the chuck table included in the laser processing apparatus shown in FIG. 1.

The focusing means 7 includes a direction converting mirror 71 for converting the direction of the processing pulsed laser beam LB1 oscillated from the processing pulsed laser beam oscillating means 6 into a downward direction as viewed in FIG. 2, an objective lens 72 for focusing the processing pulsed laser beam LB1 converted in direction by the direction converting mirror 71, the objective lens 72 being composed of a concave lens 721 and a convex lens 722, and a window lens 73 for focusing a detecting laser beam to be hereinafter described without focusing the processing pulsed laser beam LB1 passed through the objective lens 72. The window lens 73 has a trapezoidal cross section as including a central flat portion 731 adapted to unfocus a beam passing therethrough and a peripheral inclined portion 732 adapted to focus a beam passing therethrough.

The focusing means 7 further includes an actuator 74 for moving the objective lens 72 and the window lens 73, which are contained in a case, in the direction perpendicular to the holding surface (upper surface) of the chuck table 36 (i.e., in the vertical direction as viewed in FIG. 2). In this preferred embodiment, the actuator 74 is a piezoelectric motor including a piezoelectric element axially expanding according to an applied voltage. Accordingly, the actuator 74 provided by a piezoelectric motor functions as second focal position adjusting means controlled by control means to be hereinafter described for moving the objective lens 72 and the window lens 73 in the vertical direction as viewed in FIG. 2, thereby changing the focal position of the processing pulsed laser beam LB1.

The scanning mirror 60 is movable by the control means to selectively take a position shown by a solid line in FIG. 2, a position shown by a single-dot & dash line in FIG. 2, and a position shown by a double-dot & dash line in FIG. 2. When the scanning mirror 60 is set at the position shown by the solid line, the processing pulsed laser beam oscillated from the processing pulsed laser beam oscillating means 6 is focused at a focal point P as shown by a solid line. When the scanning mirror 60 is set at the position shown by the single-dot & dash line, the processing pulsed laser beam oscillated from the processing pulsed laser beam oscillating means 6 is focused at a focal point P1 shifted leftward from the focal point P by a predetermined distance in the feeding direction (X direction) as shown by a single-dot & dash line. When the scanning mirror 60 is set at the position shown by the double-dot & dash line, the processing pulsed laser beam oscillated from the processing pulsed laser beam oscillating means 6 is focused at a focal point P2 shifted rightward from the focal point P by a predetermined distance in the feeding direction (X direction) as shown by a double-dot & dash line. Thus, the scanning mirror 60 functions as the optical path changing means for changing the optical path of the processing pulsed laser beam in the feeding direction (X direction).

Referring to FIG. 2, the laser processing apparatus according to this preferred embodiment further includes height detecting means 8 for detecting the height of the workpiece held on the chuck table. The height detecting means 8 includes detecting laser beam oscillating means 80 for oscillating a detecting laser beam, a dichroic mirror 81 provided in the path between the scanning mirror 60 and the focusing means 7 for reflecting the detecting laser beam oscillated from the detecting laser beam oscillating means 80 toward the focusing means 7, annular spot forming means 82 provided between the dichroic mirror 81 and the detecting laser beam oscillating means 80 for forming the spot shape (sectional shape) of the detecting laser beam oscillated from the detecting laser beam oscillating means 80 into an annular shape, and a first beam splitter 83 provided between the annular spot forming means 82 and the dichroic mirror 81 for introducing the detecting laser beam whose spot shape (sectional shape) has been formed into an annular shape by the annular spot forming means 82 into a first path 83a leading to the dichroic mirror 81.

The detecting laser beam oscillating means 80 may be provided by a He—Ne pulsed laser oscillator for oscillating a detecting laser beam LB2a having a wavelength of 635 nm different from the wavelength of the processing pulsed laser beam LB1 oscillated from the processing pulsed laser beam oscillating means 6. In this preferred embodiment, the power of the detecting laser beam LB2a oscillated from the detecting laser beam oscillating means 80 is set to 10 mW. The dichroic mirror 81 can pass the processing pulsed laser beam LB1, but can reflect the detecting laser beam oscillated from the detecting laser beam oscillating means 80 toward the focusing means 7. In this preferred embodiment, the annular spot forming means 82 is composed of a pair of first conical lens 821 and second conical lens 822 arranged in series at a given interval along the optical path of the detecting laser beam LB2a. In this preferred embodiment, the first conical lens 821 and the second conical lens 822 are arranged so that the vertices of these conical lenses 821 and 822 are opposed to each other. As a modification, the bottoms of these conical lenses 821 and 822 may be opposed to each other or the vertices of these conical lenses 821 and 822 may be pointed in the same direction.

The annular spot forming means 82 functions to convert the detecting laser beam LB2a having a circular spot shape oscillated from the detecting laser beam oscillating means 80 into a detecting laser beam LB2*b* having an annular spot shape. As a modification, the annular spot forming means 82 may be provided by a mask member having an annular hole. The first beam splitter 83 functions to introduce the detecting laser beam LB2*b* having an annular spot shape to the first path 83*a* leading to the dichroic mirror 81 and also to introduce reflected light reflected on the dichroic mirror 81 to a second path 83*b* as will be hereinafter described.

The height detecting means 8 further includes a bandpass filter 830 provided in the second path 83*b* for passing only the reflected light corresponding to the wavelength of the detecting laser beam LB2 (635 nm in this preferred embodiment) of the reflected light reflected by the first beam splitter 83, a pinhole mask 84 having a pinhole 841 for restricting the pass of the reflected light having a diameter larger than a predetermined diameter, of the reflected light passed through the bandpass filter 830, and reflected light analyzing means 85 for analyzing the reflected light passed through the pinhole mask 84 and transmitting the result of this analyzation to the control means. The diameter of the pinhole 841 of the pinhole mask 84 is set to 1 mm, for example. The reflected light analyzing means 85 includes a second beam splitter 851 for dividing the reflected light passed through the pinhole 841 of the pinhole mask 84 into two beams respectively following a third path 85*a* and a fourth path 85*b*, a focusing lens 852 for focusing 100% of the reflected light following the third path 85*a*, and a first photodetector 853 for detecting the reflected light focused by the focusing lens 852. The first photodetector 853 transmits a voltage signal corresponding to the detected light quantity to the control means.

The reflected light analyzing means 85 further includes a second photodetector 854 for detecting the reflected light following the fourth path 85*b* and detection area restricting means 855 for restricting a detection area of the reflected light to be detected by the second photodetector 854. The detection area restricting means 855 is composed of a cylindrical lens 855*a* for linearly focusing the reflected light following the fourth path 85*b* and a one-dimensional mask 855*b* for restricting the reflected light linearly focused by the cylindrical lens 855*a* to a unit length. The second photodetector 854 for detecting the reflected light passed through the one-dimensional mask 855*b* transmits a voltage signal corresponding to the detected light quantity to the control means.

Figure 3:
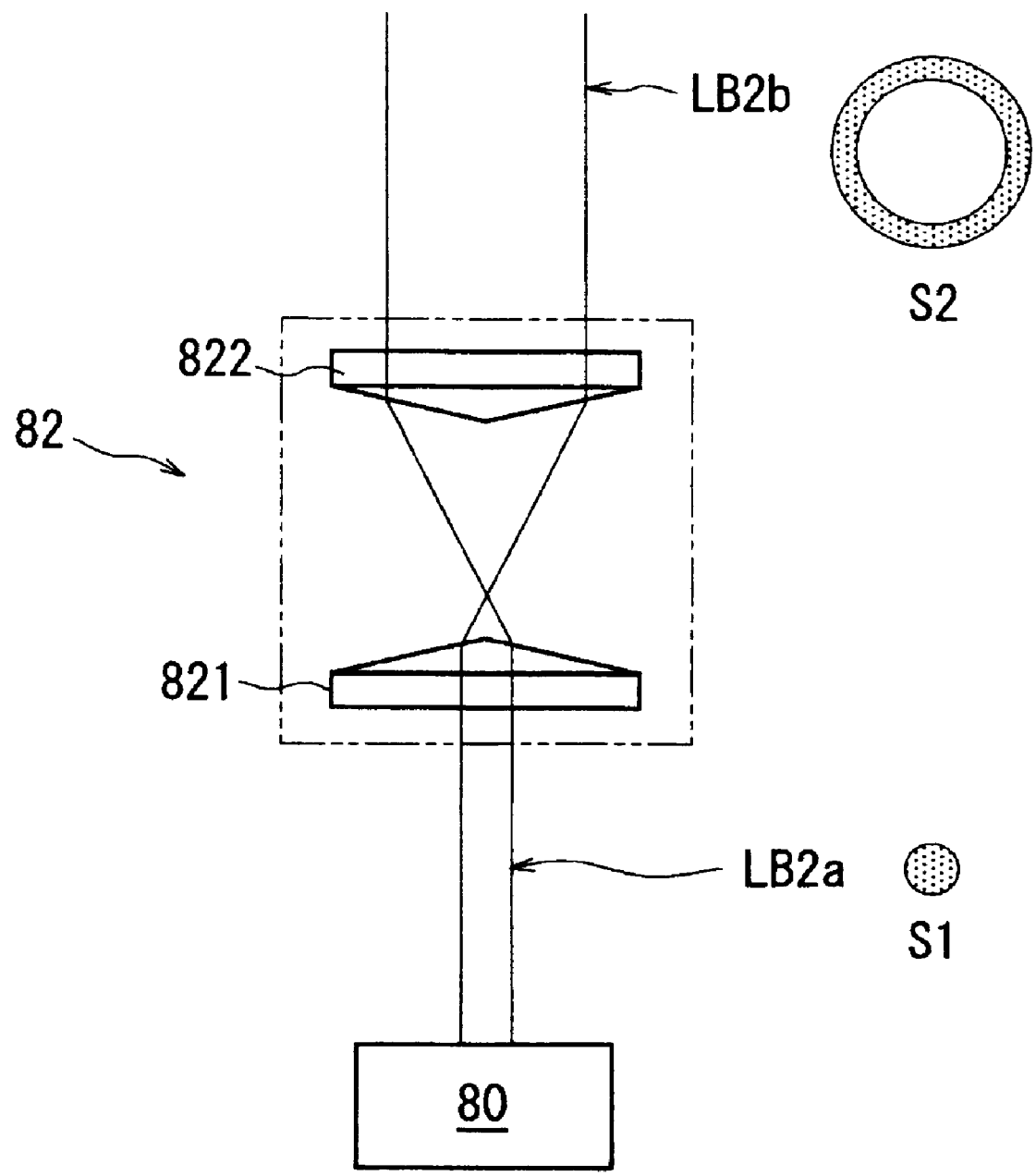
FIG. 3 is a diagram for illustrating the operation of annular spot forming means included in the height detecting means shown in FIG. 2 for converting the circular spot shape of a laser beam into an annular spot shape.

The operation of the height detecting means 8 will now be described. As shown in FIG. 3, the detecting laser beam LB2*a* having a circular spot shape S1 oscillated from the detecting laser beam oscillating means 80 is converted into the detecting laser beam LB2*b* having an annular spot shape S2 by the annular spot forming means 82. For example, the annular spot forming means 82 operates to expand the laser beam LB2*a* having a diameter of 2 mm into the laser beam LB2*b* having an outer diameter (D1) of 10 mm and an inner diameter (D2) of 8 mm as a parallel beam. As shown in FIG. 2, the detecting laser beam LB2*b* having the annular spot shape S2 formed by the annular spot forming means 82 is transmitted through the first beam splitter 83 to follow the first path 83*a* toward the dichroic mirror 81, and is then reflected by the dichroic mirror 81 toward the focusing means 7. Thereafter, the detecting laser beam LB2*b* is converted in direction by the direction converting mirror 71 as in the case of the processing pulsed laser beam LB1 to follow a downward path as shown in FIG. 2. The detecting laser beam LB2*b* thus reflected on the direction converting mirror 71 is focused by the objective lens 72 and the window lens 73, in which the objective lens 72 is composed of the concave lens 721 and the convex lens 722.

Figure 4:
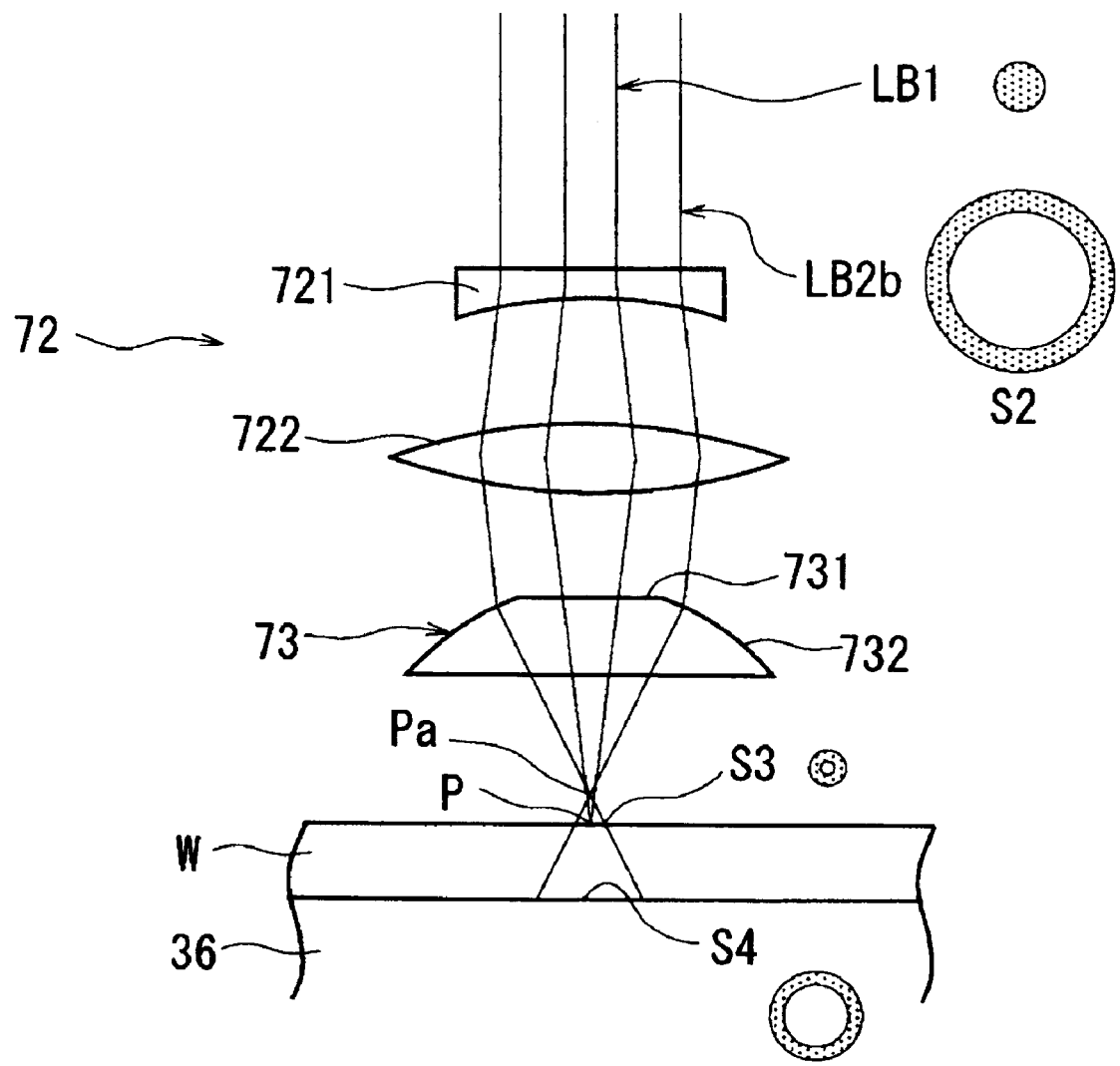
FIG. 4 is a diagram for illustrating the operation of focusing means included in the laser beam applying means and height detecting means shown in FIG. 2 for focusing a processing laser beam and a detecting laser beam.

The focal points of the detecting laser beam LB2*b* and the processing pulsed laser beam LB1 focused by the focusing means 7 will now be described with reference to FIG. 4. The processing pulsed laser beam LB1 having a diameter of 2 mm, for example, is expanded in diameter by the concave lens 721 of the objective lens 72, next converged by the convex lens 722, next passed through the central flat portion 731 of the window lens 73 without convergence, and finally focused at the focal point P. On the other hand, the detecting laser beam LB2*b* having an annular spot shape S2 with an outer diameter (D1) of 10 mm and an inner diameter (D2) of 8 mm, for example, is expanded in diameter by the concave lens 721 of the objective lens 72, next converged by the convex lens 722, next further converged by the peripheral inclined portion 732 of the window lens 73, and finally focused at the focal point Pa. Accordingly, the focal point Pa of the detecting laser beam LB2*b* is located upstream of the focal point P of the processing pulsed laser beam LB1 in the laser beam applying direction (i.e., above the focal point P as viewed in FIG. 4).

A predetermined voltage (e.g., 5 V) is applied to the actuator 74 as the second focal position adjusting means so that the focal point P of the processing pulsed laser beam LB1 is located on the upper surface of the workpiece W held on the chuck table 36. As a result, the detecting laser beam LB2*b* having the annular spot shape S2 is applied to the upper surface of the workpiece W held on the chuck table 36 so as to form an annular spot shape S3 on the upper surface of the workpiece W. Accordingly, the detecting laser beam LB2*b* is reflected on the upper surface of the workpiece W with the annular spot shape S3 (first reflected light LB2*c*). In the case that the workpiece W is formed of a transparent material such as sapphire or quartz, the detecting laser beam LB2*b* is transmitted through the workpiece W to reach the lower surface of the workpiece W and reflected on the lower surface of the workpiece W with an annular spot shape S4 larger than the annular spot shape S3 (second reflected light LB2*d*).

Both the first reflected light LB2*c* having the annular spot shape S3 reflected on the upper surface of the workpiece W and the second reflected light LB2*d* having the annular spot shape S4 reflected on the lower surface of the workpiece W are returned through the objective lens 72, the direction converting mirror 71, and the dichroic mirror 81 to the first beam splitter 83. The first reflected light LB2*c* and the second reflected light LB2*d* are next reflected by the first beam splitter 83 to follow the second path 83*b* toward the bandpass filter 830. The reflected light of the processing pulsed laser beam LB1 from the workpiece W also follows the same path as that of the detecting laser beam LB2 to reach the bandpass filter 830. The bandpass filter 830 is adapted to pass only the reflected light corresponding to the frequency of the detecting laser beam LB2, so that the reflected light of the processing pulsed laser beam LB1 is blocked by the bandpass filter 830.

Figure 5:
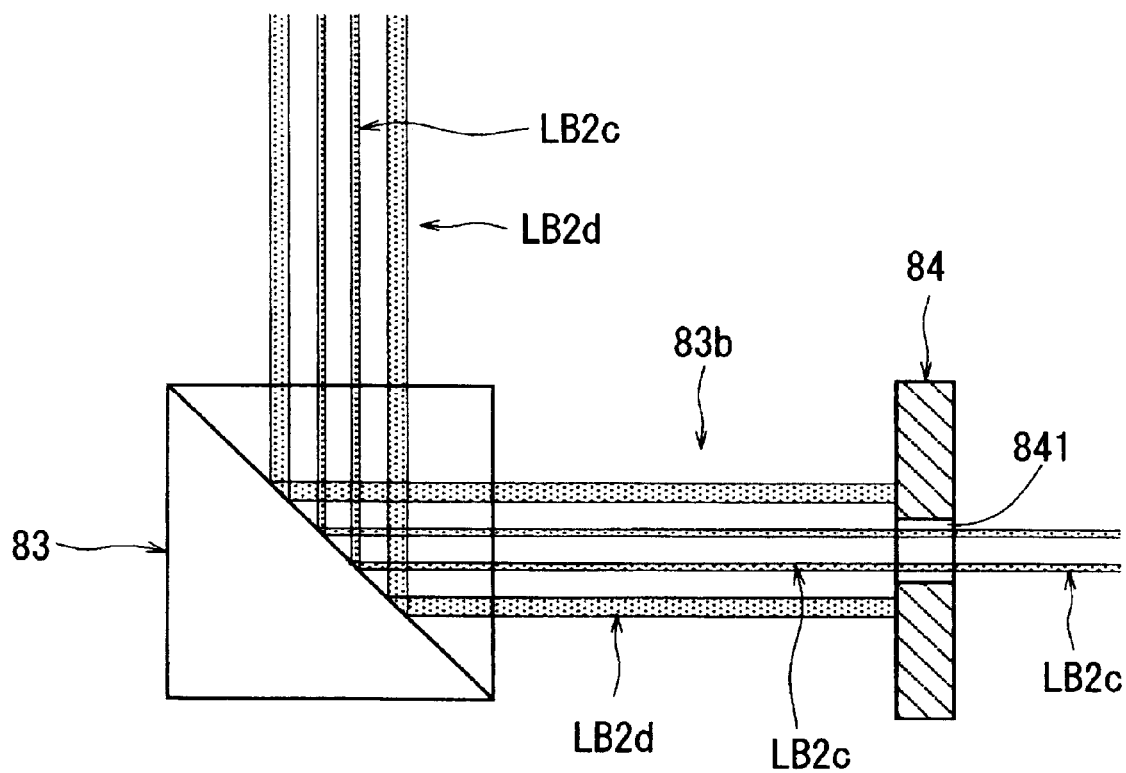
FIG. 5 is a diagram for illustrating the operation of a first beam splitter and a pinhole mask included in the height detecting means shown in FIG. 2, wherein a part of the reflected light from the workpiece is blocked by the pinhole mask and the remaining part is passed through the pinhole mask.

The first reflected light LB2*c* having the annular spot shape S3 and the second reflected light LB2*d* having the annular spot shape S4 passed through the bandpass filter 830 reach the pinhole mask 84. The pinhole 841 of the pinhole mask 84 has a diameter of 1 mm, for example. Accordingly, as shown in FIG. 5, the first reflected light LB2*c* having the annular spot shape S3 is passed through the pinhole mask 84, whereas the second reflected light LB2*d* having the annular spot shape S4 is blocked by the pinhole mask 84. The diameter of the pinhole 841 of the pinhole mask 84 is set so as to pass the first reflected light LB2*c* having the annular spot shape S3 and block the second reflected light LB2*d* having the annular spot shape S4 according to the thickness of the workpiece W and the position of the focal point Pa. Thus, the second reflected light LB2*d* having the annular spot shape S4 reflected on the lower surface of the workpiece W is blocked by the pinhole mask 84, and only the first reflected light LB2*c* having the annular spot shape S3 reflected on the upper surface of the workpiece W is passed through the pinhole 841 of the pinhole mask 84.

As shown in FIG. 2, the first reflected light LB2*c* having the annular spot shape S3 reflected on the upper surface of the workpiece W and passed through the pinhole 841 of the pinhole mask 84 is divided into two beams by the second beam splitter 851 of the reflected light analyzing means 85, in which one of the two beams follows the third path 85*a* and the other follows the fourth path 85*b*. The first reflected light LB2*c* following the third path 85*a* is focused 100% by the focusing lens 852 and detected by the first photodetector 853. The first photodetector 853 transmits a voltage signal corresponding to the detected light quantity to the control means to be hereinafter described. On the other hand, the first reflected light LB2*c* following the fourth path 85*b* is linearly focused by the cylindrical lens 855*a* of the detection area restricting means 855 and next restricted to a predetermined unit length by the one-dimensional mask 855*b* of the detection area restricting means 855. The restricted reflected light LB2*c* is next detected by the second photodetector 854. The second photodetector 854 transmits a voltage signal corresponding to the detected light quantity.

The detected light quantities of the first reflected light LB2*c* detected by the first and second photodetectors 853 and 854 will now be described. The first reflected light LB2*c* to be detected by the first photodetector 853 is focused 100% by the focusing lens 852. Accordingly, the detected light quantity by the first photodetector 853 is constant, so that a voltage value (V1) output from the first photodetector 853 is also constant (e.g., 10 V). On the other hand, the first reflected light LB2*c* to be detected by the second photodetector 854 is linearly focused by the cylindrical lens 855*a* of the detection area restricting means 855 and next restricted to a predetermined unit length by the one-dimensional mask 855*b* of the detection area restricting means 855. Accordingly, the detected light quantity by the second photodetector 854 varies according to the distance from the window lens 73 of the focusing means 7 to the upper surface of the workpiece W, i.e., the height (thickness) of the workpiece W in applying the detecting laser beam LB2*b* to the upper surface of the workpiece W as shown in FIG. 4. That is, a voltage value (V2) output from the second photodetector 854 varies according to the height of the workpiece W to which the detecting laser beam LB2*b* is applied.

Figure 6:
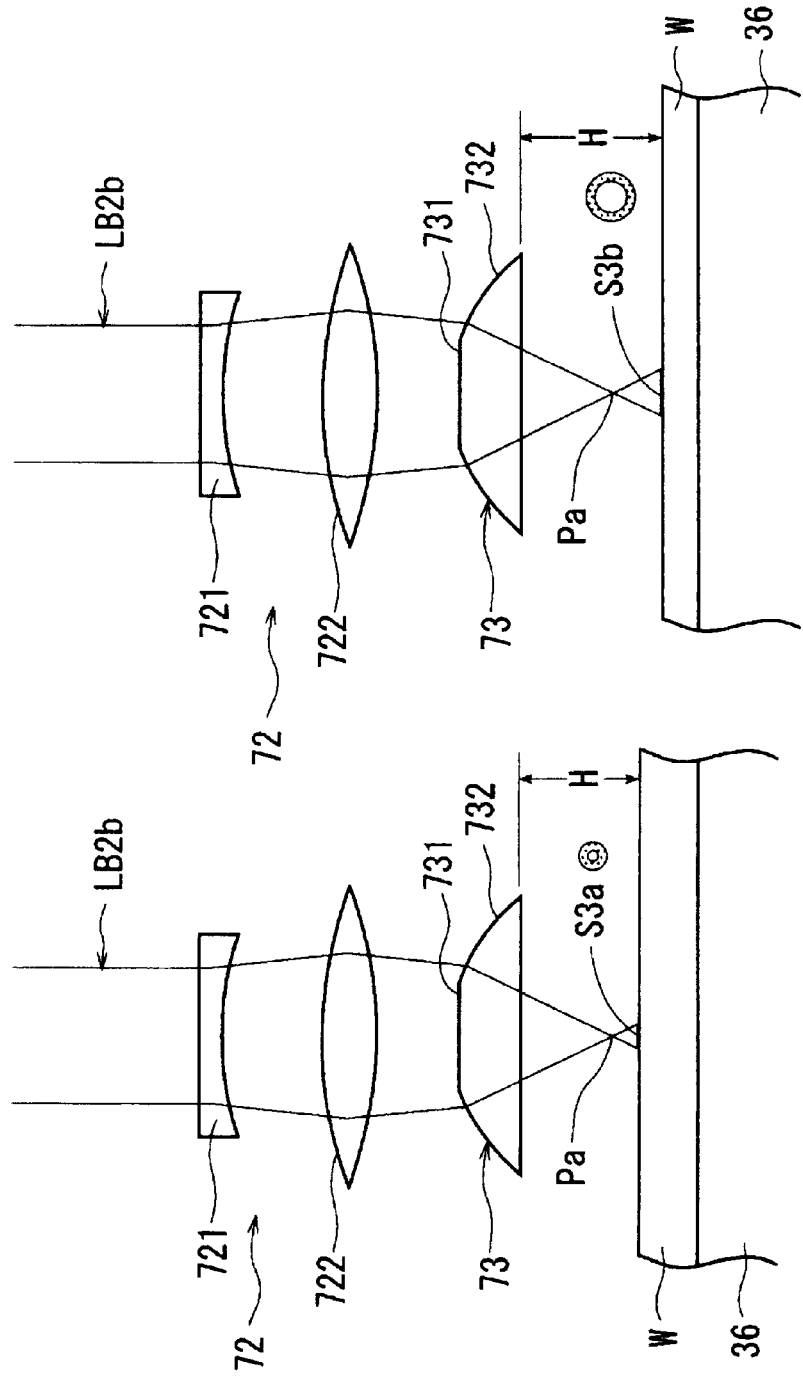
FIGS. 6A and 6B are diagrams for illustrating the condition where the detecting laser beam is applied to workpieces having different thicknesses.

More specifically, when the height of the workpiece W is large (i.e., the thickness of the workpiece W is large) as shown in FIG. 6A, the distance (H) from the window lens 73 of the focusing means 7 to the upper surface of the workpiece W is small. In this case, the detecting laser beam LB2*b* applied to the workpiece W is reflected on the upper surface of the workpiece W with an annular spot shape S3*a*. This reflected light having the annular spot shape S3*a* is divided into two beams respectively following the third path 85*a* and the fourth path 85*b* by the second beam splitter 851. The beam following the third path 85*a* is focused 100% by the focusing lens 852, so that all of the light quantity of the beam following the third path 85*a* is detected by the first photodetector 853. On the other hand, the beam following the fourth path 85*b* is linearly focused by the cylindrical lens 855*a*, so that the sectional shape of the beam focused by the cylindrical lens 855*a* becomes substantially oblong. The beam having such a substantially oblong cross section is restricted to a predetermined unit length by the one-dimensional mask 855*b*. Accordingly, a part of the light quantity of the beam following the fourth path 85*b* is detected by the second photodetector 854. That is, the detected light quantity by the second photodetector 854 is smaller than that by the first photodetector 853.

In contrast, when the height of the workpiece W is small (i.e., the thickness of the workpiece W is small) as shown in FIG. 6B, the distance (H) from the window lens 73 of the focusing means 7 to the upper surface of the workpiece W is large. In this case, the detecting laser beam LB2*b* applied to the workpiece W is reflected on the upper surface of the workpiece W with an annular spot shape S3*b* larger than the annular spot shape S3*a*. This reflected light having the annular spot shape S3*b* is divided into two beams respectively following the third path 85*a* and the fourth path 85*b* by the second beam splitter 851. The beam following the third path 85*a* is focused 100% by the focusing lens 852, so that all of the light quantity of the beam following the third path 85*a* is detected by the first photodetector 853.

On the other hand, the beam following the fourth path 85*b* is linearly focused by the cylindrical lens 855*a*, so that the sectional shape of the beam focused by the cylindrical lens 855*a* becomes substantially oblong. The length of each longer side of this substantially oblong sectional shape corresponding to the beam having the annular spot shape S3*b* is larger than that corresponding to the beam having the annular spot shape S3*a* because the annular spot shape S3*b* is larger than the annular spot shape S3*a*. Accordingly, the beam having a substantially oblong cross section corresponding to the annular spot shape S3*b* is restricted to a predetermined unit length by the one-dimensional mask 855*b*. Accordingly, a part of the light quantity of the beam following the fourth path 85*b* is detected by the second photodetector 854. Since the annular spot shape S3*b* is larger than the annular spot shape S3*a*, the detected light quantity by the second photodetector 854 in the case of FIG. 6B is smaller than that in the case of FIG. 6A. Thus, the larger the distance (H) from the window lens 73 of the focusing means 7 to the upper surface of the workpiece W, i.e., the larger the height (thickness) of the workpiece W, the more the detected light quantity by the second photodetector 854. Conversely, the smaller the distance (H) from the window lens 73 of the focusing means 7 to the upper surface of the workpiece W, i.e., the smaller the height (thickness) of the workpiece W, the less the detected light quantity by the second photodetector 854.

Figure 7:
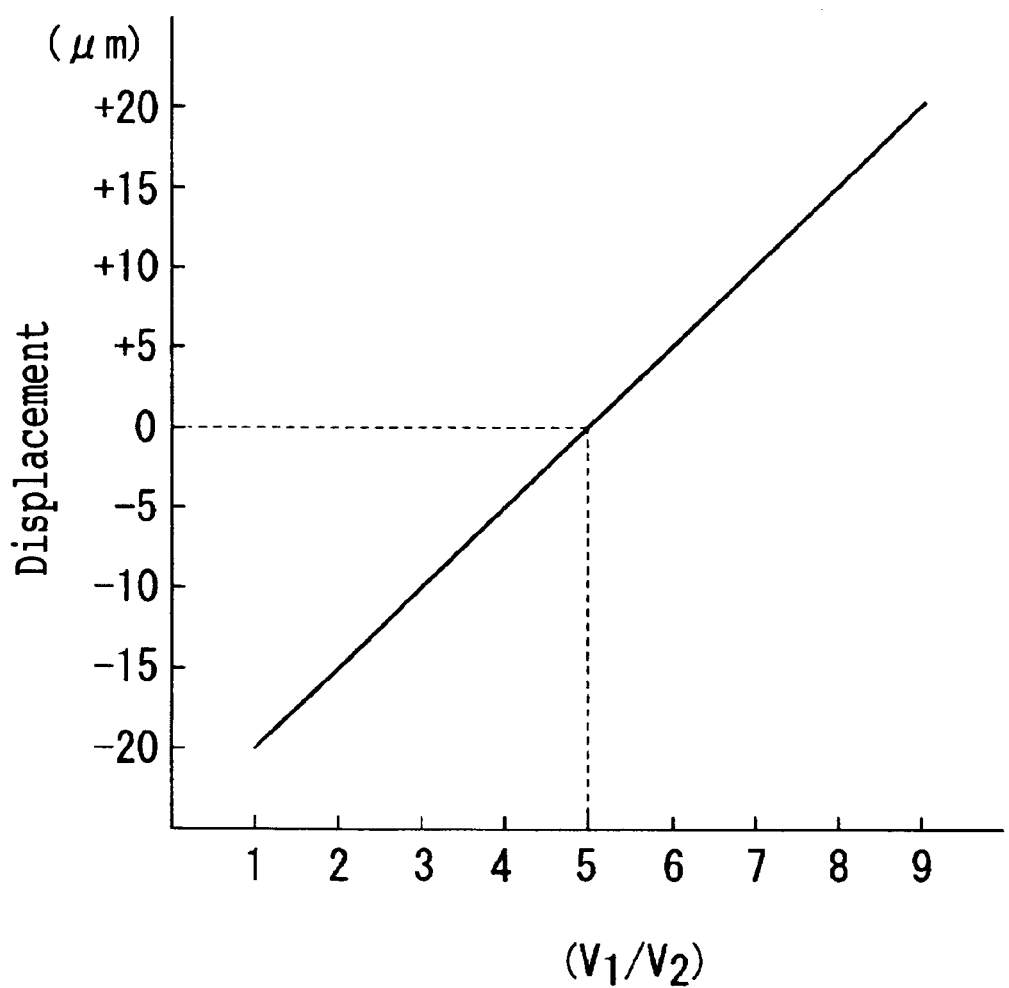
FIG. 7 is a control map showing the relation between the ratio of a voltage value (V1) output from a first photodetector included in the height detecting means shown in FIG. 2 to a voltage value (V2) output from a second photodetector included in the height detecting means and a displacement from a predetermined distance from the focusing means to the upper surface of the workpiece.

The relation between the ratio of the voltage value (V1) output from the first photodetector 853 to the voltage value (V2) output from the second photodetector 854 and the distance (H) from the window lens 73 of the focusing means 7 to the upper surface of the workpiece W, i.e., the height of the workpiece W will now be described with reference to a control map shown in FIG. 7. In FIG. 7, the horizontal axis represents the ratio (V1/V2) of the voltage value (V1) output from the first photodetector 853 to the voltage value (V2) output from the second photodetector 854, and the vertical axis represents a displacement from a predetermined distance (reference value) from the window lens 73 of the focusing means 7 to the upper surface of the workpiece W. In the example shown in FIG. 7, when a predetermined voltage (e.g., 5 V) is applied to the actuator 74 as the second focal position adjusting means, the distance (H) from the window lens 73 of the focusing means 7 to the upper surface of the workpiece W is 30.0 mm as a reference value (corresponding to zero displacement), and the ratio (V1/V2) is set to "5." When the height (thickness) of the workpiece W held on the chuck table is small, the distance (H) from the window lens 73 of the focusing means 7 to the upper surface of the workpiece W is large, so that the ratio (V1/V2) becomes larger than "5."

Conversely, when the height (thickness) of the workpiece W held on the chuck table is large, the distance (H) from the window lens 73 of the focusing means 7 to the upper surface of the workpiece W is small, so that the ratio (V1/V2) becomes smaller than "5." Accordingly, by calculating the ratio (V1/V2) between the voltage value (V1) output from the first photodetector 853 and the voltage value (V2) output from the second photodetector 854 and comparing this ratio (V1/V2) calculated above with that in the control map shown in FIG. 7, the distance (H) from the window lens 73 of the focusing means 7 to the upper surface of the workpiece W can be obtained. In other words, the displacement from the reference value for the distance (H) can be obtained. The control map shown in FIG. 7 is stored in a memory of the control means to be hereinafter described.

As described above, the detecting laser beam LB2a having the circular spot shape S1 oscillated from the detecting laser beam oscillating means 80 is converted into the detecting laser beam LB2b having the annular spot shape S2 by the annular spot forming means 82, and this detecting laser beam LB2b having the annular spot shape S2 is applied to the workpiece W. Accordingly, as shown in FIG. 4, the detecting laser beam LB2b having the annular spot shape S2 is reflected on the upper surface of the workpiece W with the annular spot shape S3. In the case that the workpiece W is transparent, the detecting laser beam LB2b is also reflected on the lower surface of the workpiece W with the annular spot shape S4. The second reflected light LB2d having the annular spot shape S4 reflected on the lower surface of the workpiece W is blocked by the pinhole mask 84, and only the first reflected light LB2c having the annular spot shape S3 reflected on the upper surface of the workpiece W is passed through the pinhole 841 of the pinhole mask 84. Then, the light quantity of the detecting laser beam LB2b is detected according to the first reflected light LB2c. Accordingly, even when the workpiece W is transparent, the height of the workpiece W can be accurately detected.

Further, the detecting laser beam LB2b having the annular spot shape S2 to be applied to the workpiece W is focused by the objective lens 72 and the window lens 73, in which the objective lens 72 is composed of the concave lens 721 and the convex lens 722. Accordingly, the NA of the focusing lens can be increased, so that the ratio in size between the annular spot shape S3 reflected on the upper surface of the workpiece W and the annular spot shape S4 reflected on the lower surface of the workpiece W can be increased. As a result, the second reflected light LB2d having the annular spot shape S4 reflected on the lower surface of the workpiece W can be reliably blocked by the pinhole mask 84.

Referring back to FIG. 1, imaging means 9 for detecting a subject area to be laser-processed by the laser beam applying means 52 is provided at the front end portion of the casing 521 of the laser beam applying means 52. The imaging means 9 includes an ordinary imaging device (CCD) for imaging the workpiece W by using visible light, infrared light applying means for applying infrared light to the workpiece W, an optical system for capturing the infrared light applied by the infrared light applying means, and an imaging device (infrared CCD) for outputting an electrical signal corresponding to the infrared light captured by the optical system. This electrical signal as an image signal output from the imaging device is transmitted to the control means.

Figure 8:
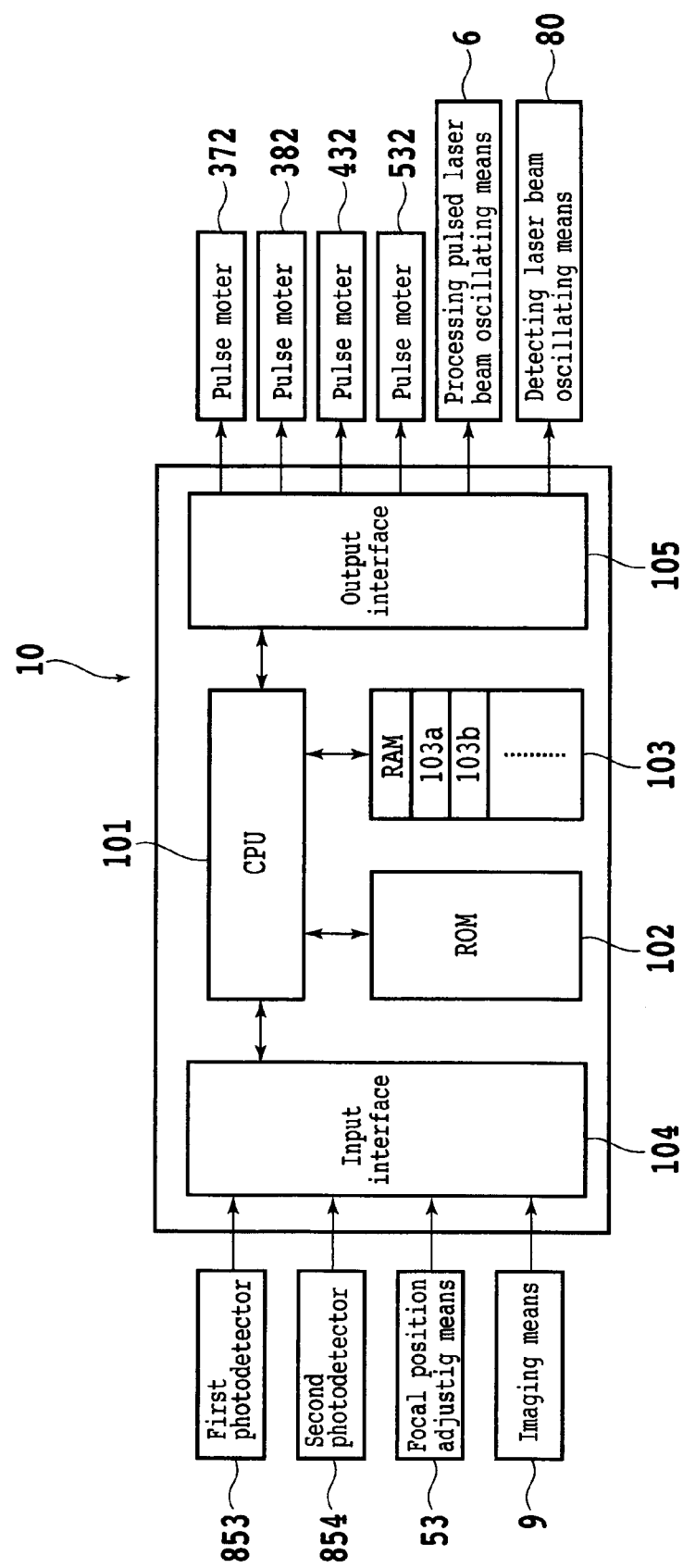
FIG. 8 is a block diagram showing control means included in the laser processing apparatus shown in FIG. 1.

The laser processing apparatus according to this preferred embodiment includes control means 10 shown in FIG. 8. The control means 10 is provided by a computer, which includes a central processing unit (CPU) 101 for performing computations according to a control program, a read only memory (ROM) 102 preliminarily storing the control program, etc., a random access memory (RAM) 103 for storing computational results, etc., an input interface 104, and an output interface 105. Various detection signals from the first photodetector 853, the second photodetector 854, and the imaging means 9 are input into the input interface 104 of the control means 10. Further, various control signals are output from the output interface 105 of the control means 10 to the pulse motor 372, the pulse motor 382, the pulse motor 432, the pulse motor 532, the processing pulsed laser beam oscillating means 6, the scanning mirror 60, the actuator 74 as the second focal position adjusting means, and the detecting laser beam oscillating means 80.

Figure 9:
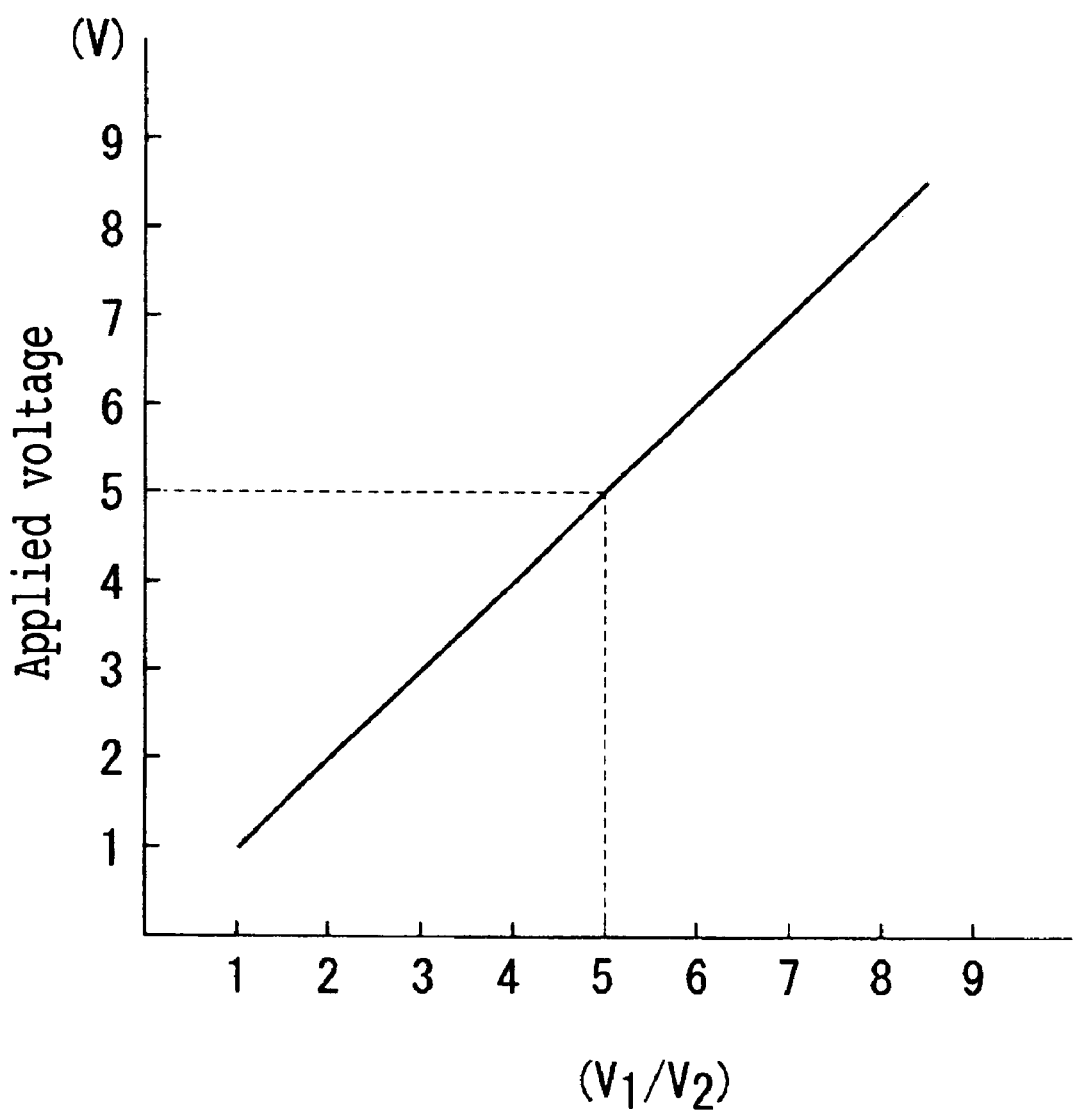
FIG. 9 is a control map showing the relation between the ratio (V1/V2) mentioned above and a voltage to be applied to an actuator included in the focusing means.

The random access memory (RAM) 103 includes a first memory area 103a for storing the control map shown in FIG. 7, a second memory area 103b for storing a control map shown in FIG. 9 to be hereinafter described, and other memory areas. The control map shown in FIG. 9 preliminarily sets a voltage to be applied to the actuator 74 as the second focal position adjusting means according to the ratio (V1/V2) between the voltage value (V1) output from the first photodetector 853 and the voltage value (V2) output from the second photodetector 854. According to the control map shown in FIG. 9, the applied voltage to the actuator 74 is set to 5 V when the voltage ratio (V1/V2) is "5." Further, when the voltage ratio (V1/V2) is less than "5," the applied voltage to the actuator 74 is set to less than 5 V, whereas when the voltage ratio (V1/V2) is greater than "5," the applied voltage to the actuator 74 is set to greater than 5 V. Accordingly, by controlling the applied voltage to the actuator 74 according to the control map shown in FIG. 9, the voltage ratio (V1/V2) between the voltage value (V1) output from the first photodetector 853 and the voltage value (V2) output from the second photodetector 854 can be controlled to become "5." As a result, the distance (H) from the window lens 73 of the focusing means 7 to the upper surface of the workpiece W can be controlled to a constant value.

Figure 10:
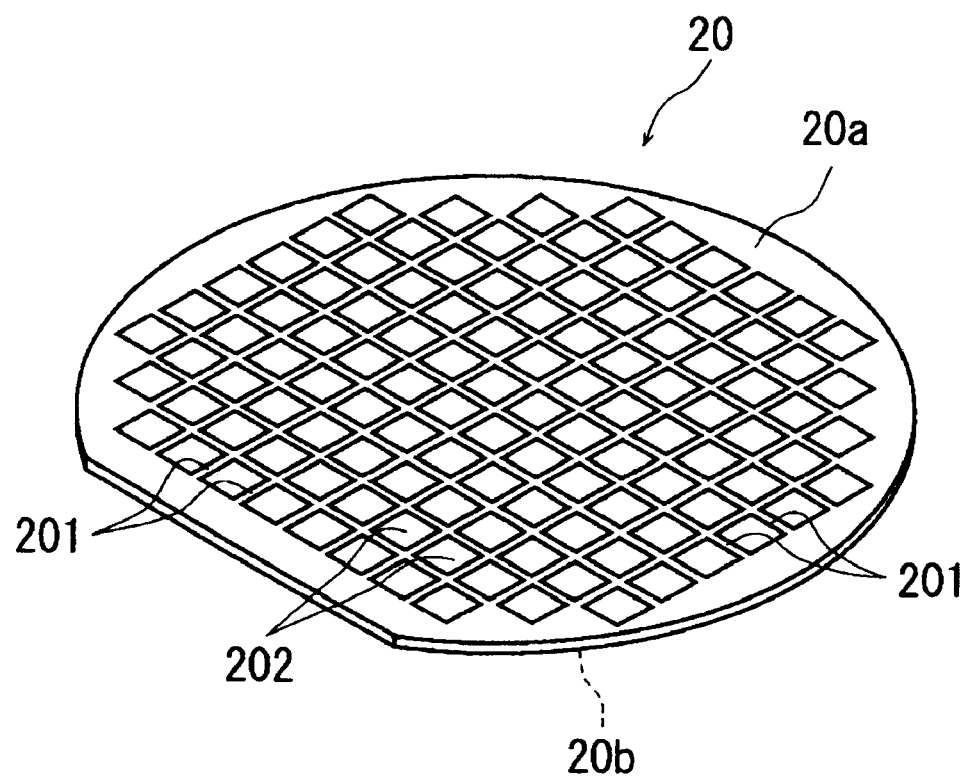
FIG. 10 is a perspective view of an optical device wafer as a workpiece.

The operation of the laser processing apparatus according to this preferred embodiment will now be described. FIG. 10 is a perspective view of an optical device wafer 20 as a workpiece to be laser-processed by the laser processing apparatus. The optical device wafer 20 shown in FIG. 10 is provided by a sapphire wafer, which has a front side (upper surface) 20a and a back side (lower surface) 20b. The upper surface 20a of the optical device wafer 20 is formed with a plurality of crossing streets 201 to thereby define a plurality of partitioned regions arranged like a matrix, and a plurality of optical devices 202 such as light emitting diodes and laser diodes are formed in these partitioned regions.

Figure 11:
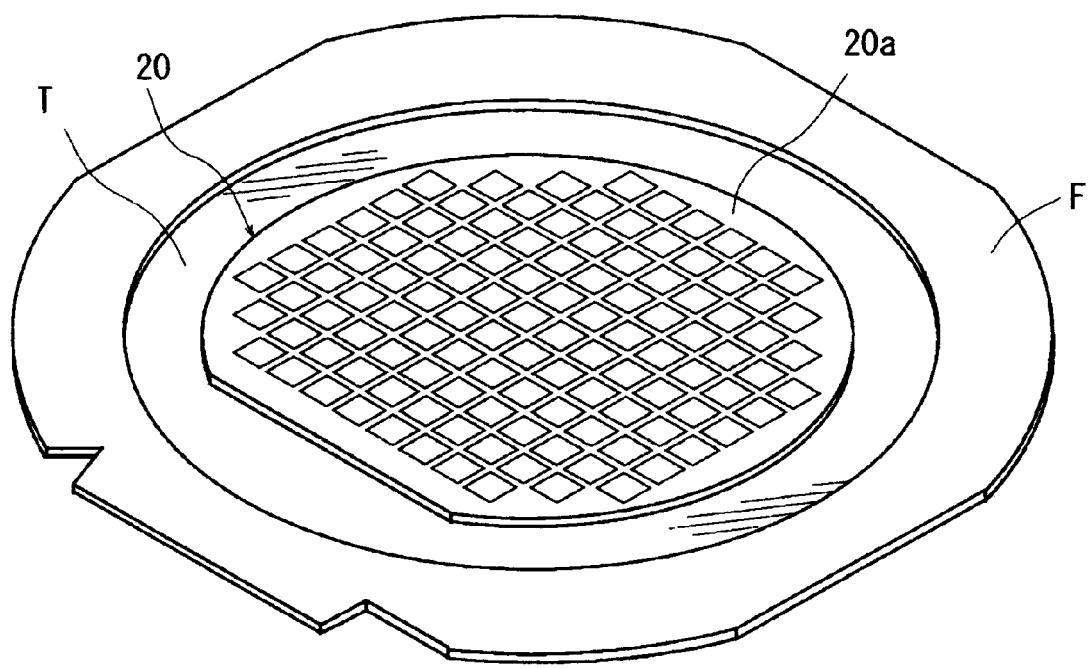
FIG. 11 is a perspective view of the optical device wafer in the condition where it is attached to a dicing tape mounted on an annular frame.

Prior to performing laser processing such that a pulsed laser beam is applied to the optical device wafer 20 along the streets 201 to thereby form laser processed grooves, the optical device wafer 20 is attached to a dicing tape T mounted on an annular frame F as shown in FIG. 11. More specifically, the front side 20a of the optical device wafer 20 is oriented upward, and the back side 20b of the optical device wafer 20 is attached to the dicing tape T.

The laser processing apparatus is used to apply a laser beam along the streets 201 of the optical device wafer 20, thereby forming laser processed grooves along the streets 201 on the upper surface 20a of the optical device wafer 20. More specifically, the optical device wafer 20 is placed on the chuck table 36 of the laser processing apparatus shown in FIG. 1 in the condition where the front side 20a of the optical device wafer 20 is oriented upward, and the optical device wafer 20 is then held by suction on the chuck table 36. The chuck table 36 thus holding the optical device wafer 20 is moved to a position directly below the imaging means 9 by the feeding means 37.

When the chuck table 36 is positioned directly below the imaging means 9, an alignment operation for detecting a subject area of the optical device wafer 20 to be laser-processed is performed by the imaging means 9 and the control means 10. More specifically, the imaging means 9 and the control means 10 perform image processing such as pattern matching for making the alignment of the streets 201 extending in a predetermined first direction on the optical device wafer 20 and the focusing means 7 of the laser beam applying means 52, thus performing the alignment for the streets 201 in the first direction. Similarly, the alignment is performed for the other streets 201 extending in a second direction perpendicular to the first direction on the optical device wafer 20.

Figure 12A:
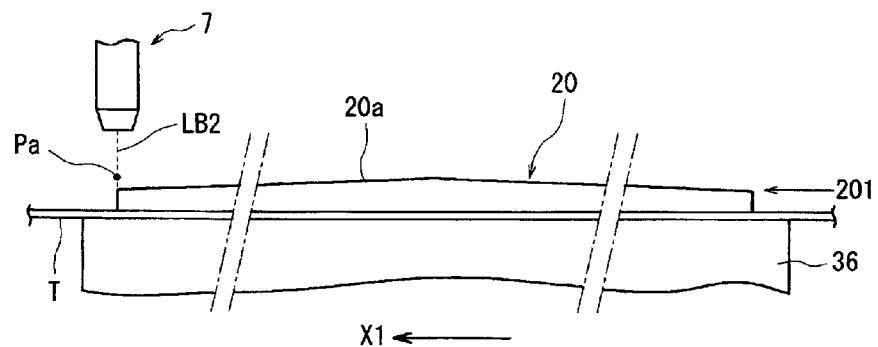
FIGS. 12A to 12C and FIGS. 13A and 13B are side views for illustrating a laser processing operation such that a laser beam is applied to the optical device wafer along streets by using the laser processing apparatus shown in FIG. 1.

After performing the alignment operation mentioned above, the chuck table 36 is moved to locate one end of a predetermined one of the streets 201 extending in the first direction (left end as viewed in FIG. 12A) directly below the focusing means 7 as shown in FIG. 12A. Thereafter, the scanning mirror 60 as the optical path changing means for changing the optical path of the processing pulsed laser beam LB1 is set to the position shown by the single-dot & dash line in FIG. 2 in order that the processing pulsed laser beam LB1 oscillated from the processing pulsed laser beam oscillating means 6 is focused at the focal point P1 as shown by the single-dot & dash line in FIG. 2. Thereafter, a predetermined voltage (e.g., 5 V) is applied to the actuator 74 as the second focal position adjusting means, and the first focal position adjusting means 53 is also operated to thereby set the distance from the window lens 73 of the focusing means 7 to the optical device wafer 20 to 30 mm.

Figure 12B:
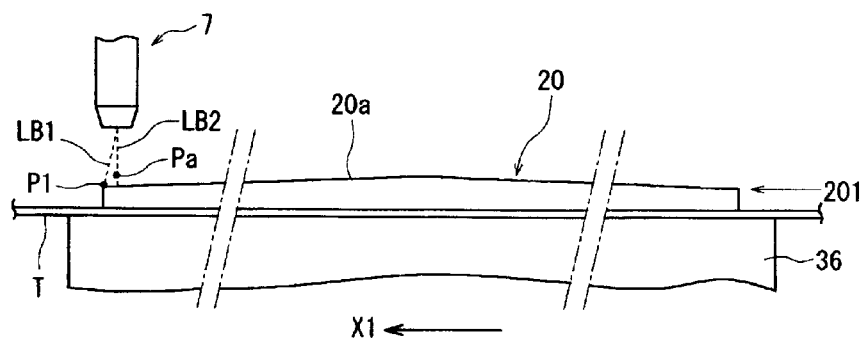

Thereafter, the height detecting means 8 is operated to apply the detecting laser beam LB2b to the upper surface of the optical device wafer 20 held on the chuck table 36. At the same time, the chuck table 36 is moved in the direction shown by an arrow X1 in FIG. 12A to detect the height of the optical device wafer 20. The control means 10 computes the ratio (V1/V2) between the voltage value (V1) output from the first photodetector 853 of the height detecting means 8 and the voltage value (V2) output from the second photodetector 854 of the height detecting means 8, and then obtains a voltage to be applied to the actuator 74 as the second focal position adjusting means according to the voltage ratio (V1/V2) computed above by using the control map shown in FIG. 9. When the left end of the optical device wafer 20 reaches a position corresponding to the focal position P1 of the processing pulsed laser beam LB1 as shown in FIG. 12B, the voltage obtained above is applied to the actuator 74. Thus, the timing of application of the voltage to the actuator 74 is delayed from the time the detecting laser beam LB2b is applied to the left end of the optical device wafer 20 to the time the processing pulsed laser beam LB1 is applied to the left end of the optical device wafer 20 by delaying means (not shown).

Figure 12C:
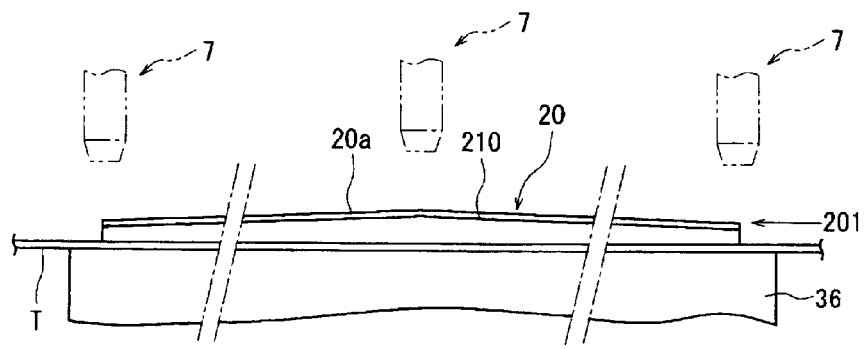

The delay time relating to the application of the voltage to the actuator 74 is preliminarily set according to the moving speed of the chuck table 36. For example, when the spacing between the focal point P and the focal point P1 is 2 mm and the work feed speed (i.e., the moving speed of the chuck table 36) is 100 mm/sec, the delay time is set to 2/100 sec (=0.02 sec). Thus, the control means 10 applies the voltage to the actuator 74 and operates the processing pulsed laser beam oscillating means 6. Thereafter, the control means 10 controls the applied voltage to the actuator 74 so that the ratio (V1/V2) between the voltage value (V1) output from the first photodetector 853 and the voltage value (V2) output from the second photodetector 854 becomes "5." As a result, as shown in FIG. 12C, the focusing means 7 is vertically moved according to variations in thickness of the optical device wafer 20, so that the distance (H) from the window lens 73 of the focusing means 7 to the upper surface of the optical device wafer 20 is controlled to a predetermined value. Accordingly, as shown in FIG. 12C, a laser processed groove 210 having a uniform depth from the upper surface of the optical device wafer 20 is formed along the predetermined street 201 on the front side 20a of the optical device wafer 20.

For example, the laser processing operation mentioned above is performed under the following processing conditions.

Figure 13A:
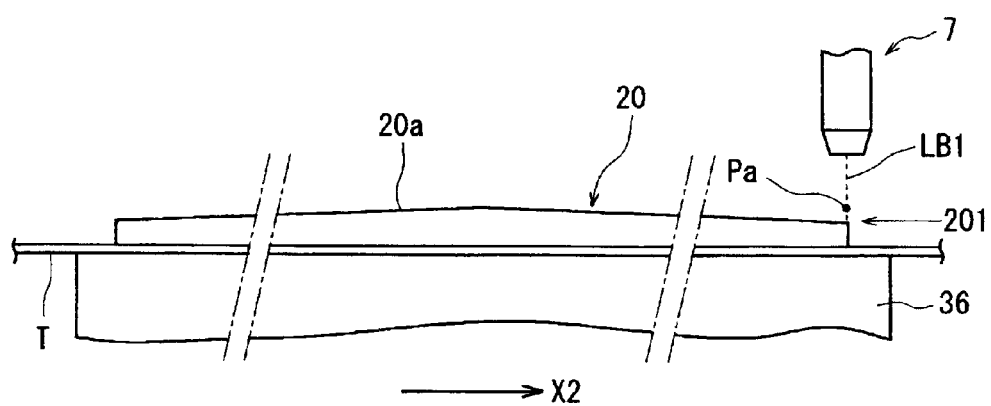

Laser: YVO4 pulsed laser
Wavelength: 355 nm
Repetition frequency: 100 kHz
Average power: 5 W
Focused spot diameter: φ10 μm
Work feed speed: 100 mm/sec After performing the laser processing operation along the predetermined street 201 extending in the first direction on the optical device wafer 20, the first indexing means 38 is operated to move the chuck table 36 in the direction perpendicular to the sheet plane of FIG. 13A (i.e., in the indexing direction shown by the arrow Y in FIG. 1) by the spacing between the adjacent streets 201. Then, the other end of the next street 201 extending in the first direction (right end as viewed in FIG. 13A) is located directly below the focusing means 7 as shown in FIG. 13A. Thereafter, the scanning mirror 60 as the optical path changing means for changing the optical path of the processing pulsed laser beam LB1 is set to the position shown by the double-dot & dash line in FIG. 2 in order that the processing pulsed laser beam LB1 oscillated from the processing pulsed laser beam oscillating means 6 is focused at the focal point P2 as shown by the double-dot & dash line in FIG. 2. Thereafter, a predetermined voltage (e.g., 5 V) is applied to the actuator 74 as the second focal position adjusting means.

Figure 13B:
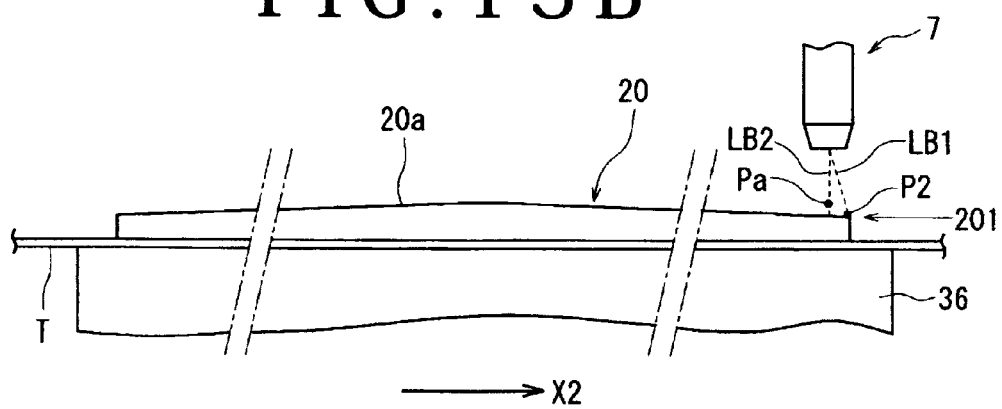

Thereafter, the height detecting means 8 is operated to apply the detecting laser beam LB2b to the upper surface of the optical device wafer 20 held on the chuck table 36. At the same time, the chuck table 36 is moved in the direction shown by an arrow X2 in FIG. 13A to detect the height of the optical device wafer 20. The control means 10 computes the ratio (V1/V2) between the voltage value (V1) output from the first photodetector 853 and the voltage value (V2) output from the second photodetector 854, and then obtains a voltage to be applied to the actuator 74 according to the voltage ratio (V1/V2) computed above by using the control map shown in FIG. 9. When the right end of the optical device wafer 20 reaches a position corresponding to the focal point P2 of the processing pulsed laser beam LB1 as shown in FIG. 13B, the voltage obtained above is applied through the delaying means to the actuator 74. Thus, the control means 10 applies the voltage to the actuator 74 and operated the processing pulsed laser beam oscillating means 6. Thereafter, the control means 10 controls the applied voltage to the actuator 74 so that the ratio (V1/V2) between the voltage value (V1) output from the first photodetector 853 and the voltage value (V2) output from the second photodetector 854 becomes "5."

After performing the laser processing operation along all of the streets 201 extending in the first direction on the optical device wafer 20, the chuck table 36 is rotated 90° to similarly perform the laser processing operation along all of the other streets 201 extending in the second direction perpendicular to the first direction on the optical device wafer 20. Thus, the laser processing operation is completed along all of the streets 201 formed on the optical device wafer 20. Thereafter, the chuck table 36 holding the optical device wafer 20 is returned to the original position to cancel the suction holding of the optical device wafer 20. Thereafter, the optical device wafer 20 is subjected to a dividing step by transporting means (not shown).

Figure 14:
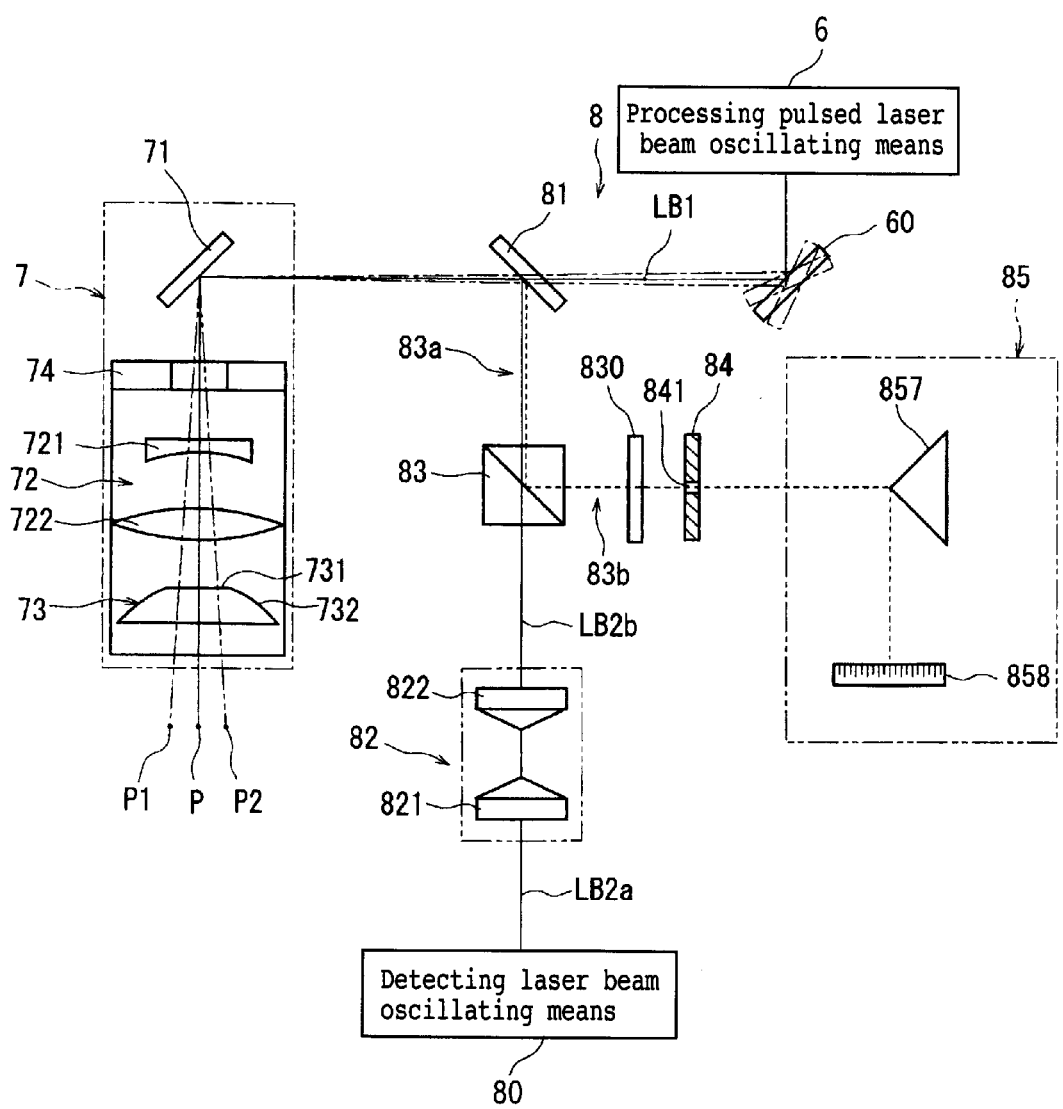
FIG. 14 is a block diagram showing another preferred embodiment of the laser beam applying means and the height detecting means held on the chuck table included in the laser processing apparatus shown in FIG. 1.

Another preferred embodiment of the height detecting means 8 will now be described with reference to FIG. 14. The height detecting means 8 shown in FIG. 14 is substantially the same as that shown in FIG. 2 except the configuration of the reflected light analyzing means 85, so the same parts are denoted by the same reference numerals and the description thereof will be omitted herein. The reflected light analyzing means 85 of the height detecting means 8 shown in FIG. 14 is composed of a conical mirror 857 for converting the reflected light having the annular spot shape passed through the pinhole 841 of the pinhole mask 84 into reflected light having a linear spot shape and a position sensor 858 for detecting the position of the reflected light having the linear spot shape reflected by the conical mirror 857. The position sensor 858 may be provided by a position sensitive detector (PSD) or a CCD line sensor, for example. A detection signal from the position sensor 858 is transmitted to the control means 10 shown in FIG. 8.

The operation of the height detecting means 8 shown in FIG. 14 will now be described. As in the height detecting means 8 shown in FIG. 2, the first reflected light LB2c having the annular spot shape S3 reflected on the upper surface of the workpiece W and the second reflected light LB2d having the annular spot shape S4 reflected on the lower surface of the workpiece W reach the pinhole mask 84 as shown in FIG. 5. The second reflected light LB2d having the annular spot shape S4 reflected on the lower surface of the workpiece W is blocked by the pinhole mask 84, and only the first reflected light LB2c having the annular spot shape S3 reflected on the upper surface of the workpiece W is passed through the pinhole 841 of the pinhole mask 84.

Figure 15:
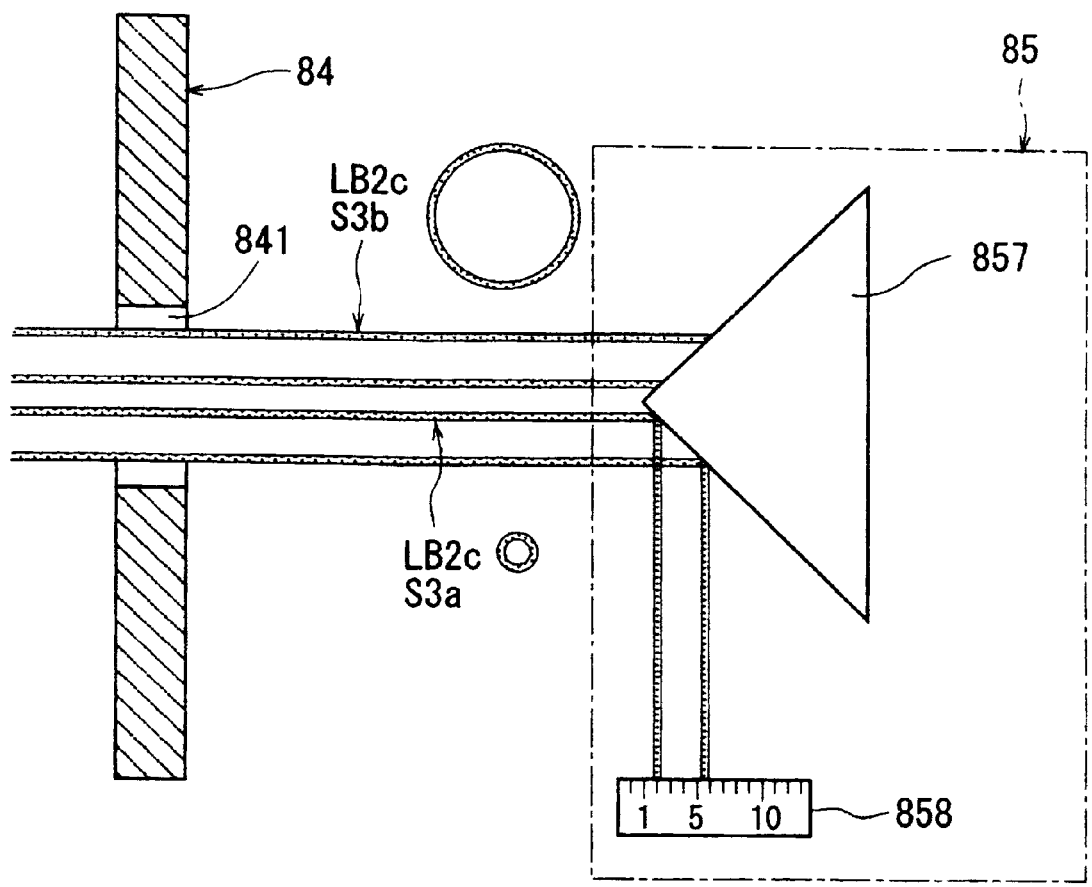
FIG. 15 is a diagram for illustrating the operation of a conical mirror included in the height detecting means shown in FIG. 14, wherein the position of a linear spot reflected by the conical mirror varies according to the size of an annular spot entering the conical mirror.

The first reflected light LB2c having the annular spot shape S3 reflected on the upper surface of the workpiece W and passed through the pinhole 841 of the pinhole mask 84 is converted into reflected light having a linear spot shape by the conical mirror 857 of the reflected light analyzing means 85, and this reflected light having the linear spot shape is reflected toward the position sensor 858 by the conical mirror 857. The position of such a linear spot shape converted from the annular spot shape S3 of the first reflected light LB2c will now be described with reference to FIG. 15.

In the case that the first reflected light LB2c having the annular spot shape S3 has a smaller annular spot shape S3a as shown in FIG. 6A, the first reflected light LB2c having the smaller annular spot shape S3a is reflected on the front end portion of the conical mirror 857 (left end portion as viewed in FIG. 15), and the linear spot converted from the annular spot S3a is applied to the position sensor 858 at a first position. On the other hand, in the case that the first reflected light LB2c having the annular spot shape S3 has a larger annular spot shape S3b as shown in FIG. 6B, the first reflected light LB2c having the larger annular spot shape S3b is reflected on the rear end portion of the conical mirror 857 (right end portion as viewed in FIG. 15), and the linear spot converted from the annular spot S3b is applied to the position sensor 858 at a second position different from the first position. Thus, the first reflected light LB2c having the annular spot shape S3 reflected by the conical mirror 857 is applied to the position sensor 858 at different positions according to the size of the annular spot shape S3. The size of the annular spot shape S3 of the first reflected light LB2c varies according to the height of the workpiece W to which the detecting laser beam LB2b is applied.

More specifically, when the height of the workpiece W is large (i.e., the thickness of the workpiece W is large) as shown in FIG. 6A, the distance (H) from the window lens 73 of the focusing means 7 to the upper surface of the workpiece W is small. In this case, the detecting laser beam LB2b applied to the workpiece W is reflected on the upper surface of the workpiece W with the smaller annular spot S3a. In contrast, when the height of the workpiece W is small (i.e., the thickness of the workpiece W is small) as shown in FIG. 6B, the distance (H) from the window lens 73 of the focusing means 7 to the upper surface of the workpiece W is large. In this case, the detecting laser beam LB2b applied to the workpiece W is reflected on the upper surface of the workpiece W with the larger annular spot shape S3b, which is larger than the annular spot shape S3a.

Thus, the smaller the distance (H) from the window lens 73 of the focusing means 7 to the upper surface of the workpiece W, the smaller the size of the annular spot S3 of the first reflected light LB2c reflected on the upper surface of the workpiece W. Conversely, the larger the distance (H) from the window lens 73 of the focusing means 7 to the upper surface of the workpiece W, the larger the size of the annular spot S3 of the first reflected light LB2c reflected on the upper surface of the workpiece W. Accordingly, by converting the annular spot S3 of the first reflected light LB2c reflected on the upper surface of the workpiece W and passed through the pinhole 841 of the pinhole mask 84 into the linear spot by the conical mirror 857 of the reflected light analyzing means 85 and then applying the reflected light having the linear spot to the position sensor 858, the height of the workpiece W can be obtained according to the position of the linear spot on the position sensor 858.

Figure 16:
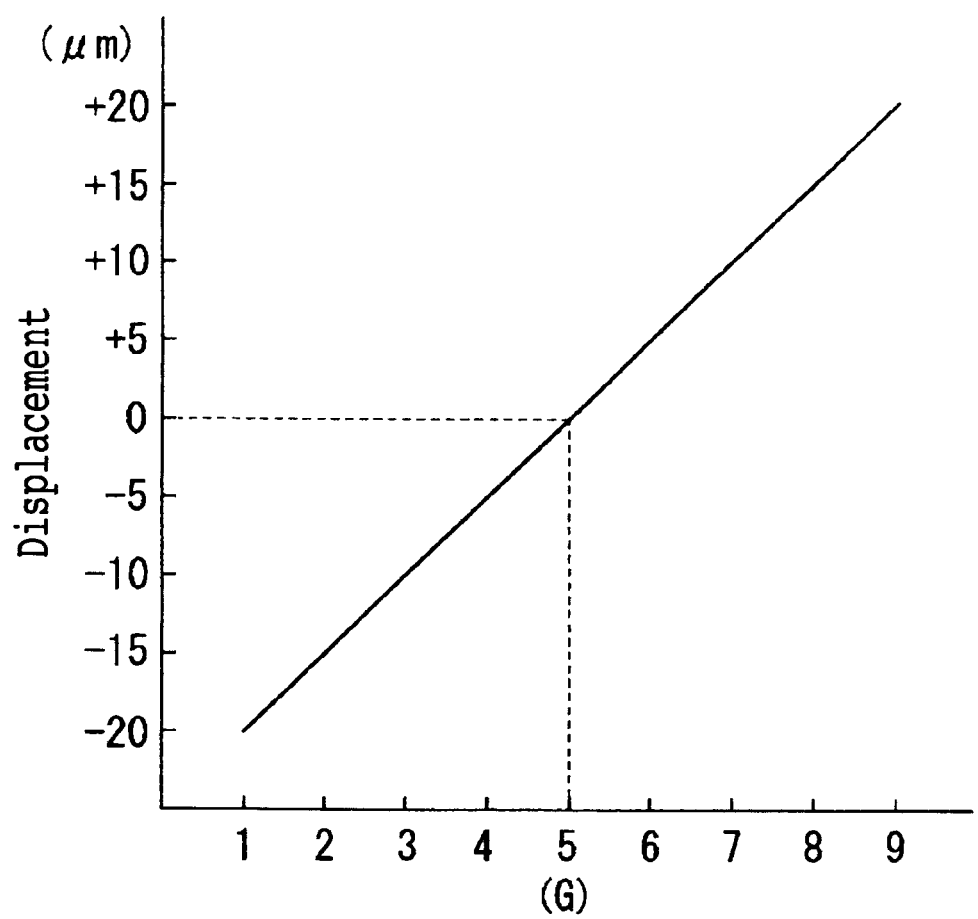
FIG. 16 is a control map showing the relation between a position signal (G) output from a position sensor included in the height detecting means shown in FIG. 14 and a displacement from a predetermined distance from the focusing means to the upper surface of the workpiece.

The relation between a position signal output from the position sensor 858 according to the position of the linear spot on the position sensor 858 and the distance (H) from the window lens 73 of the focusing means 7 to the upper surface of the workpiece W, i.e., the height of the workpiece W will now be described with reference to a control map shown in FIG. 16. In FIG. 16, the horizontal axis represents the position signal (G) output from the position sensor 858, and the vertical axis represents a displacement from a predetermined distance (reference value) from the window lens 73 of the focusing means 7 to the upper surface of the workpiece W. In the example shown in FIG. 16, when a predetermined voltage (e.g., 5 V) is applied to the actuator 74 as the second focal position adjusting means, the distance (H) from the window lens 73 of the focusing means 7 to the upper surface of the workpiece W is 30.0 mm as a reference value (corresponding to zero displacement), and the position signal (G) output from the position sensor 858 is set to "5." When the height (thickness) of the workpiece W held on the chuck table is small, the distance (H) from the window lens 73 of the focusing means 7 to the upper surface of the workpiece W is large, so that the position signal (G) output from the position sensor 858 becomes larger than "5."

Conversely, when the height (thickness) of the workpiece W held on the chuck table is large, the distance (H) from the window lens 73 of the focusing means 7 to the upper surface of the workpiece W is small, so that the position signal (G) output from the position sensor 858 becomes smaller than "5." Accordingly, by comparing the position signal (G) output from the position sensor 858 with that in the control map shown in FIG. 16, the distance (H) from the window lens 73 of the focusing means 7 to the upper surface of the workpiece W can be obtained. In other words, the displacement from the reference value for the distance (H) can be obtained. The control map shown in FIG. 16 is stored in the random access memory (RAM) 103 of the control means 10 shown in FIG. 8.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A laser processing apparatus comprising:

a chuck table having a holding surface for holding a plate-like workpiece;

processing laser beam applying means for applying a processing laser beam to the upper surface of said workpiece held on said chuck table, said processing laser beam applying means including processing laser beam oscillating means for oscillating said processing laser beam and focusing means for focusing said processing laser beam oscillated by said processing laser beam oscillating means;

feeding means for relatively moving said chuck table and said processing laser beam applying means in a feeding direction;

focal position adjusting means for changing the focal position of said processing laser beam to be focused by said focusing means;

height detecting means for detecting the height of said workpiece held on said chuck table; and control means for controlling said focal position adjusting means according to a detection signal from said height detecting means;

said height detecting means including:

detecting laser beam oscillating means for oscillating a detecting laser beam having a wavelength different from the wavelength of said processing laser beam;

annular spot forming means for forming a spot shape of said detecting laser beam oscillated by said detecting laser beam oscillating means into an annular spot shape;

a detecting laser beam applying path for leading said detecting laser beam having said annular spot shape from said annular spot forming means to said focusing means;

a detecting laser beam reflecting path for leading reflected light obtained by reflecting said detecting laser beam applied through said detecting laser beam applying path and said focusing means to said workpiece held on said chuck table;

a pinhole mask provided in said detecting laser beam reflecting path for passing the reflected light reflected from the upper surface of said workpiece, but blocking the reflected light reflected from the lower surface of said workpiece; and reflected light analyzing means for analyzing the reflected light passed through said pinhole mask and transmitting the result of analyzation to said control means;

said focusing means including:

an objective lens for focusing said processing laser beam and said detecting laser beam; and a window lens for focusing said detecting laser beam having said annular spot shape without focusing said processing laser beam.

2. The laser processing apparatus according to claim 1, wherein said processing laser beam applying means further comprises optical path changing means for changing the optical path of said processing laser beam to be focused by said focusing means in said feeding direction.

\* \* \* \* \*